(12) United States Patent
Lee et al.

(10) Patent No.: US 9,012,877 B2
(45) Date of Patent: Apr. 21, 2015

(54) SEMICONDUCTOR DEVICE INCLUDING A DIODE AND METHOD OF MANUFACTURING THE SAME

(71) Applicant: Samsung Electronics Co., Ltd., Suwon-Si, Gyeonggi-Do (KR)

(72) Inventors: Jae-kyu Lee, Yongin-si (KR); Seung-pil Ko, Hwaseong-si (KR); Yong-jun Kim, Suwon-si (KR); Eun-jung Kim, Daegu (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 50 days.

(21) Appl. No.: 13/684,884

(22) Filed: Nov. 26, 2012

(65) Prior Publication Data

US 2013/0234090 A1    Sep. 12, 2013

(30) Foreign Application Priority Data

Mar. 7, 2012    (KR) .................. 10-2012-0023599

(51) Int. Cl.
*H01L 29/02* (2006.01)
*H01L 45/00* (2006.01)
*H01L 27/24* (2006.01)

(52) U.S. Cl.
CPC ............ *H01L 45/00* (2013.01); *H01L 27/2409* (2013.01); *H01L 27/2463* (2013.01); *H01L 45/06* (2013.01); *H01L 45/1233* (2013.01); *H01L 45/141* (2013.01); *H01L 45/144* (2013.01); *H01L 45/1675* (2013.01); *H01L 45/1683* (2013.01)

(58) Field of Classification Search
USPC .................. 257/1–5, E29.002; 438/102–104
See application file for complete search history.

(56) References Cited

U.S. PATENT DOCUMENTS

| | | | |
|---|---|---|---|
| 7,704,849 B2 | 4/2010 | Subramanian | |
| 2008/0230787 A1* | 9/2008 | Suzuki et al. | 257/77 |
| 2008/0280440 A1* | 11/2008 | Chang | 438/684 |
| 2009/0142902 A1* | 6/2009 | Subramanian | 438/424 |
| 2010/0105210 A1* | 4/2010 | Chen et al. | 438/702 |
| 2010/0117049 A1* | 5/2010 | Lung et al. | 257/4 |
| 2010/0159675 A1 | 6/2010 | Jeong et al. | |
| 2010/0252831 A1 | 10/2010 | Park | |
| 2010/0314682 A1* | 12/2010 | Yilmaz et al. | 257/328 |
| 2011/0143477 A1 | 6/2011 | Lee et al. | |
| 2013/0334614 A1* | 12/2013 | Liaw | 257/401 |

FOREIGN PATENT DOCUMENTS

| | | |
|---|---|---|
| KR | 2009-0026674 A | 3/2009 |
| KR | 2009-0076223 A | 7/2009 |
| KR | 10-0962020 B1 | 6/2010 |

* cited by examiner

*Primary Examiner* — Jami M Valentine
(74) *Attorney, Agent, or Firm* — Harness, Dickey & Pierce, P.L.C.

(57) ABSTRACT

A semiconductor device includes a first semiconductor layer extending in a first direction on a substrate, a plurality of second semiconductor layers spaced apart in the first direction on the first semiconductor layer, and an insulation layer structure surrounding side walls of the first semiconductor layer and the plurality of second semiconductor layers. The first semiconductor layer may have a first conductivity type, and the plurality of second semiconductor layers may have a second conductivity type.

16 Claims, 31 Drawing Sheets

SEMICONDUCTOR DEVICE INCLUDING A DIODE AND METHOD OF MANUFACTURING THE SAME

CROSS-REFERENCE TO RELATED APPLICATIONS

This application claims the benefit of Korean Patent Application No. 10-2012-0023599, filed on Mar. 7, 2012, in the Korean Intellectual Property Office, the disclosure of which is incorporated herein in its entirety by reference.

BACKGROUND

1. Field

Example embodiments relate to a semiconductor device and a method of manufacturing the same, and more particularly, to a semiconductor device including a diode, and a method of manufacturing the semiconductor device.

2. Description of the Related Art

As a degree of integration of semiconductor devices increases, forming a plurality of diodes in a small area may be required. As the size of diodes decreases, electrical characteristics of semiconductor devices including the diode may be deteriorated. For example, an off-leakage current is increased.

SUMMARY

Example embodiments of the inventive concepts provide a semiconductor device having desirable electrical characteristics. Example embodiments of the inventive concepts also provide a method of manufacturing a semiconductor device having desirable electrical characteristics.

According to example embodiments, a semiconductor device may include a first semiconductor layer extending in a first direction on a substrate, a plurality of second semiconductor layers spaced apart in the first direction on the first semiconductor layer, and an insulation layer structure surrounding side walls of the first semiconductor layer and the plurality of second semiconductor layers. The first semiconductor layer may have a first conductivity type, and the plurality of second semiconductor layers may have a second conductivity type.

The first semiconductor layer and the plurality of second semiconductor layers may have a same crystalline direction as the substrate. The side walls of the first semiconductor layer may have a slope. A width of the first semiconductor layer in a second direction perpendicular to the first direction may be less than or equal to 30 nm. A width of each of the plurality of second semiconductor layers in a second direction perpendicular to the first direction may be less than or equal to 30 nm. A lower width of the first semiconductor layer may be larger than an upper width of the first semiconductor layer.

A first upper surface of the first semiconductor layer may be higher than a second upper surface of the first semiconductor layer, the first upper surface including the plurality of second semiconductor layers formed thereon and the second upper surface not including the plurality of second semiconductor layers. A height of the first semiconductor layer on which the plurality of second semiconductor layers are formed may be lower than a height of the first semiconductor layer on which the plurality of second semiconductor layers are not formed. The first semiconductor layer may include at least one facet at one end contacting the substrate, the at least one facet tilting at an angle from an upper surface of the substrate.

The semiconductor device may further include an interface layer on an interface of the first semiconductor layer and the insulation layer structure and on an interface of the plurality of second semiconductor layers and the insulation layer structure. The interface layer may be a thermal oxide layer. The insulation layer structure may include a first insulation layer filling a first trench and extending in the first direction, the first trench being defined by an upper surface of the substrate and side walls of the first semiconductor layer and the plurality of second semiconductor layers, and a second insulation layer filling a second trench and extending in a second direction perpendicular to the first direction, the second trench being defined by an upper surface of the first semiconductor layer not covered by the plurality of second semiconductor layers and the side walls of the plurality of second semiconductor layers.

The first semiconductor layer may be a plurality of first semiconductor layers, a bottom surface of the insulation layer structure may extend in the first direction between adjacent semiconductor layers of the plurality of first semiconductor layers, and an upper surface of the insulation layer structure may have a mesh shape connected in the first direction and a second direction perpendicular to the first direction.

According to example embodiments, a semiconductor device may include a substrate including a cell region and a peripheral circuit region, a plurality of gate structures on the substrate in the peripheral circuit region, a blocking insulation layer covering the plurality of gate structures on the substrate in the peripheral circuit region, a plurality of first semiconductor layers on the substrate in the cell region, a plurality of second semiconductor layers on the plurality of first semiconductor layers, a plurality of phase change memory units on the plurality of second semiconductor layers, each of the plurality of phase change memory units including a lower electrode, a phase change material layer pattern, and an upper electrode, and an insulation layer structure surrounding side walls of the plurality of first and second semiconductor layers.

The plurality of first semiconductor layers may have a same crystalline direction as the substrate, and a first upper surface of the plurality of first semiconductor layers may be higher than a second upper surface of the plurality of first semiconductor layers, the first upper surface including the plurality of second semiconductor layers formed thereon and the second upper surface not including the plurality of second semiconductor layers.

According to example embodiments, a semiconductor device may include a plurality of first conductive structures extending in a first direction on a substrate, and a plurality of second conductive structures extending in a second direction and spaced apart in the first direction on the plurality of first conductive structures, the plurality of first and second conductive structures including single crystal semiconductor layers.

The plurality of first and second conductive structures may have a same crystalline direction as the substrate. The semiconductor device may further include an insulation layer structure surrounding side walls of the plurality of first and second conductive structures, and a plurality of phase change memory units on the plurality of second conductive structures, each of the plurality of phase change memory units including a lower electrode, a phase change material layer pattern, and an upper electrode. The side walls of the plurality of first conductive structures may have a slope. A lower width of the plurality of first conductive structures may be larger than an upper width of the plurality of first conductive structures.

BRIEF DESCRIPTION OF THE DRAWINGS

Example embodiments of the inventive concepts will be more clearly understood from the following detailed description taken in conjunction with the accompanying drawings in which.

DETAILED DESCRIPTION OF EXAMPLE EMBODIMENTS

Figure 1:
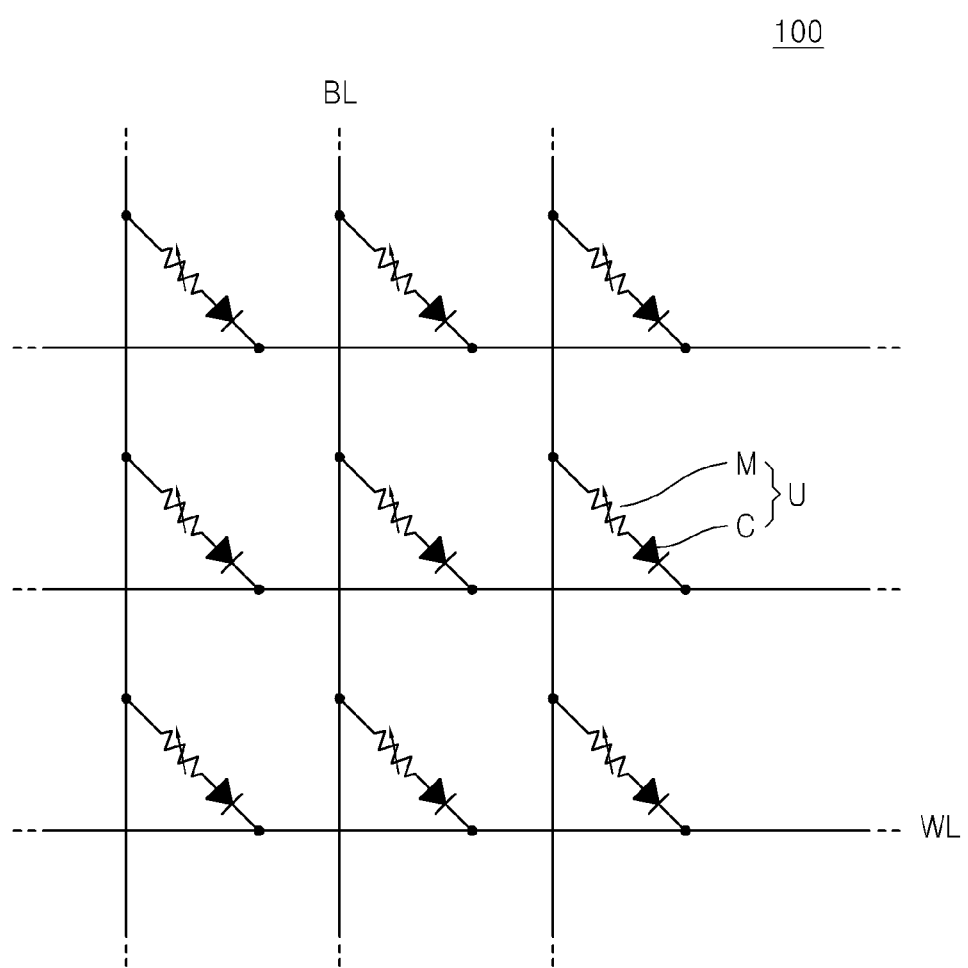
FIG. 1 is a circuit diagram schematically illustrating a semiconductor device according to example embodiments of the inventive concepts.

Hereinafter, example embodiments will be described in detail with reference to the attached drawings. The inventive concepts may, however, be embodied in many different forms and should not be construed as being limited to the example embodiments set forth herein; rather, these example embodiments are provided so that this disclosure will be thorough and complete, and will fully convey the inventive concepts to those of ordinary skill in the art. In the drawings, like reference numerals denote like elements, and the sizes and thicknesses of layers and regions are exaggerated for clarity.

It will be understood that, although the terms 'first', 'second', 'third', etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concepts.

The terminology used herein is for the purpose of describing particular embodiments only and is not intended to be limiting of the inventive concepts. As used herein, the singular forms 'a', 'an' and 'the' are intended to include the plural forms as well, unless the context clearly indicates otherwise. It will be further understood that the terms 'comprises' and/or 'comprising,' when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which the inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

When example embodiments of the inventive concepts may be modified, for example, a process may be performed differently than described. For example, actually, processes that are described as being sequentially performed may be simultaneously performed or may be performed differently than described.

As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing.

As used herein, the term "and/or" includes any and all combinations of one or more of the associated listed items. Expressions such as "at least one of," when preceding a list of elements, modify the entire list of elements and do not modify the individual elements of the list.

FIG. 1 is a circuit diagram schematically illustrating a semiconductor device 100 according to example embodiments of the inventive concepts. Referring to FIG. 1, the semiconductor device 100 includes unit cells U of a plurality of memory devices arranged in a matrix form. Each of the unit cells U may include an access region C and a memory region M. The unit cells U may be electrically connected to a word line WL and a bit line BL. The word line WL and the bit line BL may cross each other at a given (or, alternatively predetermined) angle, and for example, may be perpendicularly arranged in a 2 dimensional (2D) manner. The access region C controls a current supply to the memory region M according to a voltage applied to the word line WL. The access region C may be a p-n junction diode. The memory region M may include a phase change memory unit. Alternatively, the memory region M may include a nonvolatile memory device, e.g., a magnetic memory device or a resistive memory device.

Figure 2:
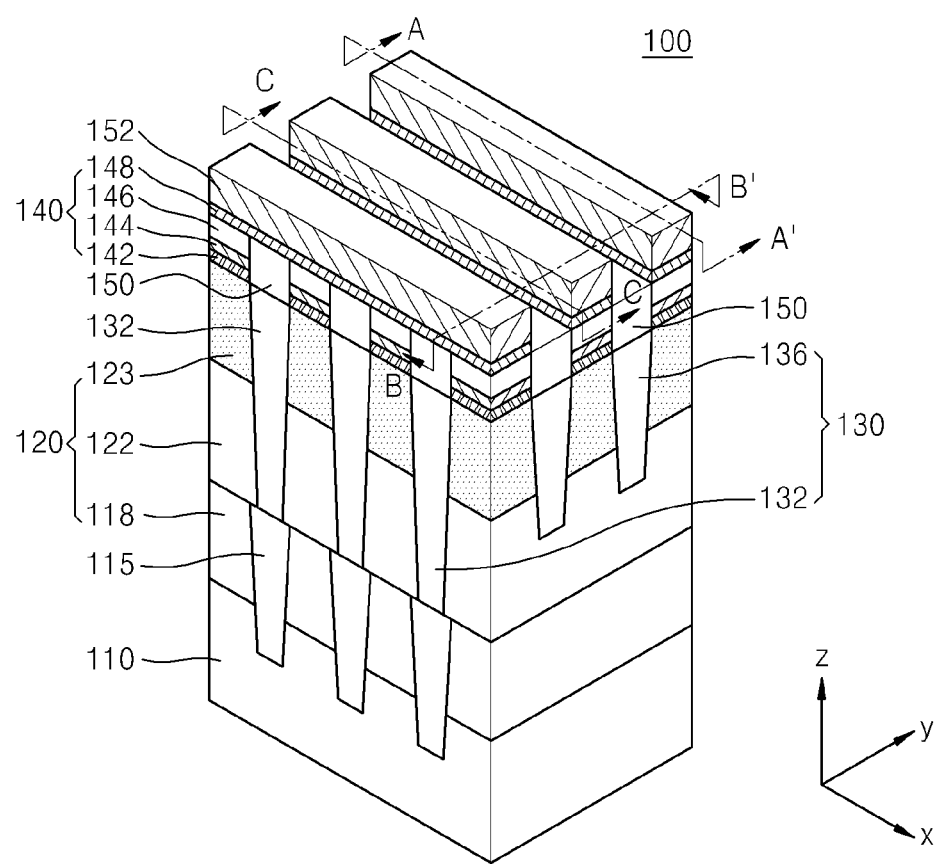
FIG. 2 is a perspective view of a semiconductor device according to example embodiments of the inventive concepts.
Figure 3:
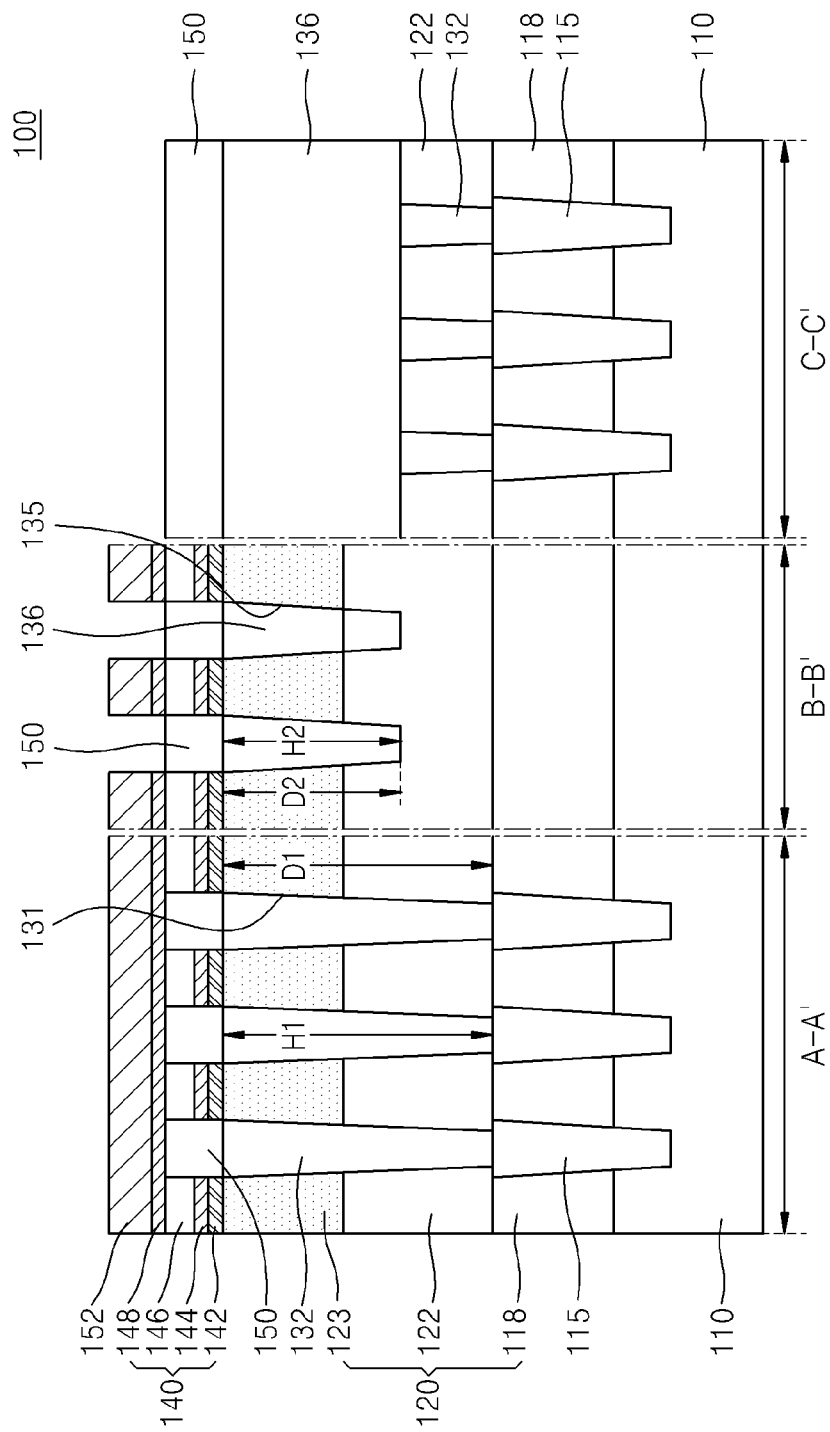
FIG. 3 is a cross-sectional view taken along lines A-A', B-B', and C-C' of FIG. 2.

FIG. 2 is a perspective view of the semiconductor device 100 according to example embodiments of the inventive concepts, and FIG. 3 is a cross-sectional view taken along lines A-A', B-B', and C-C' of FIG. 2.

Referring to FIGS. 2 and 3, the semiconductor device 100 includes a plurality of conductive structures 120 formed on a substrate 110, a plurality of phase change memory units 140, and an insulation layer structure 130. According to example embodiments, the conductive structures 120 may be a p-n junction diode including a p-type semiconductor layer and an n-type semiconductor layer. The conductive structure 120 may be formed such that the n-type semiconductor layer is connected at a plurality of unit cells, and the n-type semiconductor layer may operate as a word line (refer to the word line WL of FIG. 1).

The substrate 110 may be a semiconductor substrate, e.g., a silicon substrate, a silicon-germanium substrate, or a germanium substrate. Hereinafter, for convenience of description, the substrate 110 is a single crystal silicon substrate. A well region doped with impurities may be further formed on the substrate 110. FIG. 2 shows a cell region of the substrate 110, and a peripheral region including a peripheral circuit, a transistor, and a wire, may be further formed on the substrate 110.

A plurality of isolation layers 115 extending in a first direction (y-direction of FIG. 2) and spaced apart from each other in a second direction (x-direction of FIG. 2) having a given (or, alternatively predetermined) angle with the first direction are formed on the substrate 110. A plurality of active regions are defined in the substrate 110 by the isolation layers 115.

The conductive structure 120 may be formed such that it extends in a perpendicular direction from the inside of the substrate 110 in the active region and has a given (or, alternatively predetermined) height from a top surface of the substrate 110. The conductive structure 120 is separated from an adjacent conductive structure 120 by the isolation layer 115 and the insulation layer structure 130. The conductive structure 120 may include a first semiconductor layer 118, a second semiconductor layer 122, and a plurality of third semiconductor layers 123, which are sequentially stacked in the stated order.

The first semiconductor layer 118 may be formed inside the substrate 110 between the adjacent isolation layers 115, and may extend in the y-direction. A top surface of the first semiconductor layer 118 and a top surface of the substrate 110 may be substantially on the same plane. A bottom surface of the first semiconductor layer 118 may have a higher level than a bottom surface of the isolation layer 115. Accordingly, the conductive structure 120 including the first semiconductor layer 118 may be electrically separated from the adjacent conductive structure 120 in the substrate 110 by the isolation layer 115. The first semiconductor layer 118 may be a single crystal semiconductor layer including first impurities having a first conductivity type. According to example embodiments, the first impurities may be n-type impurities, e.g., phosphorous (P), arsenic (As), antimony (Sb), or bismuth (Bi). For example, the first semiconductor layer 118 may include a P-doped single crystal silicon layer. The first semiconductor layer 118 may be formed in a single crystal silicon substrate in FIGS. 2 and 3, but alternatively, a single crystal silicon layer having a given (or, alternatively predetermined) height may be formed on a single crystal silicon substrate, and the first semiconductor layer 118 may be formed in the single crystal silicon layer.

The second semiconductor layer 122 may be formed on the first semiconductor layer 118, and may extend in the y-direction. A second trench 135 extending in the x-direction may be formed on the second semiconductor layer 122, and thus the tops of the second semiconductor layers 122 may be spaced apart from each other in the y- and x-directions. The second semiconductor layers 122 may extend along an extending direction of a word line, and may be separated from each other in a direction intersecting the word line. Meanwhile, a bottom surface of the second trench 135 may have a given (or, alternatively predetermined) depth from the top surface of the second semiconductor layer 122. A height of the second semiconductor layer 122 on which the third semiconductor layer 123 is formed may be lower than a height of the second semiconductor layer 122 on which the third semiconductor layer 123 is not formed. Accordingly, a top surface of the second semiconductor layer 122 on which the third semiconductor layer 123 is formed may be higher than a top surface of the second semiconductor layer 122 on which the third semiconductor layer 123 is not formed.

According to example embodiments, the second semiconductor layer 122 may include a semiconductor layer having a same crystalline direction as the first semiconductor layer 118. For example, when the first semiconductor layer 118 has a crystalline direction parallel to a crystallographic plane (001) of silicon, the second semiconductor layer 122 may also have a crystalline direction parallel to the crystallographic plane (001) of silicon. The second semiconductor layer 122 may be a single crystal semiconductor layer including second impurities having the first conductivity type. According to example embodiments, the second impurities may have the same conductivity type as the first impurities of the first semiconductor layer 118, and may have lower concentration than the first impurities. For example, the second semiconductor layer 122 may include a P-doped single crystal silicon layer.

According to example embodiments, the second semiconductor layer 122 may have a width less than or equal to about 30 nm in the x-direction. Also, a lower width of the second semiconductor layer 122 may be wider than an upper width of the second semiconductor layer 122. Accordingly, a side wall of the second semiconductor layer 122 may have a given (or, alternatively predetermined) slope so that the width of the second semiconductor layer 122 in the x-direction increases downward.

The plurality of third semiconductor layers 123 may be spaced apart from each other in the y-direction on the second semiconductor layer 122. Bottom surfaces of the third semiconductor layers 123 may be on a higher level than the bottom surface of the second trench 135. The third semiconductor layer 123 may include a semiconductor layer having a same crystalline direction as the first semiconductor layer 118. The third semiconductor layer 123 may be a single crystal semiconductor layer including third impurities having a second conductivity type that is different from the first conductivity type.

According to example embodiments, the third impurities may be p-type impurities, e.g., boron (B), gallium (Ga), or indium (In). For example, the third semiconductor layer 123 may include a B-doped single crystal silicon layer. According to example embodiments, the third semiconductor layer 123 may have a width less than or equal to about 30 nm in the x-direction. Also, a lower width of the third semiconductor layer 123 may be wider than an upper width of the third semiconductor layer 123. Accordingly, a side wall of the third semiconductor layer 123 may have a given (or, alternatively predetermined) slope so that the width of the third semiconductor layer 123 in the x-direction is increased downward.

The insulation layer structure 130 may be connected to the isolation layer 115, and surrounds the side walls of the second and third semiconductor layers 122 and 123. The insulation layer structure 130 includes a first insulation layer 132 and a second insulation layer 136 respectively formed in a first trench 131 and the second trench 135.

The first insulation layer 132 may be formed in the first trench 131 having a first depth D1, and extends in the y-direction. The first trench 131 may be defined by the top surface of the isolation layer 115, and the side walls of the second and third semiconductor layers 122 and 123, and extends in the y-direction. Meanwhile, the top of the first insulation layer 132 may be separated by the second trench 135 extending in the x-direction, and thus may be spaced apart in the y-direction. According to example embodiments, the top surface of the first insulation layer 132 may be on the same plane as the top surface of the conductive structure 120. The bottom surface of the first insulation layer 132 may be substantially on the same plane as the top surface of the substrate 110. The first insulation layer 132 may include a silicon oxide, a silicon nitride, or a silicon oxynitride.

The second insulation layer 136 is formed inside the second trench 135 having a second depth D2, and extends in the x-direction. The second trench 135 extends in the x-direction and is defined by the side walls of the third semiconductor layer 123 and the top surface and side walls of the second semiconductor layer 122 on which the third semiconductor layer 123 is not formed. The top surface of the second insulation layer 136 may be on the same plane as the top surface of the conductive structure 120. The bottom surface of the second insulation layer 136 may be on a lower level than the bottom surface of the third semiconductor layer 123. According to example embodiments, the first depth D1 of the first trench 131 may be larger than the second depth D2 of the second trench 135. The second insulation layer 136 may be filled in a first region where the first and second trench 131 and 135 cross each other. Accordingly, the first insulation layer 132 may be formed in the first trench 131 excluding the first region, and crosses the second insulation layer 136. According to example embodiments, the second insulation layer 136 may include a silicon oxide, a silicon nitride, or a silicon oxynitride. For example, the second insulation layer 136 may substantially include the same material as the first insulation layer 132.

The insulation layer structure 130 includes the first and second insulation layers 132 and 136 respectively formed in the first and second trenches 131 and 135, wherein the first and second trenches 131 and 135 cross each other. Accordingly, a bottom of the insulation layer structure 130 extends in the y-direction between the adjacent second semiconductor layers 122, and a top of the insulation layer structure 130 may have a mesh shape extending and connected in the x- and y-directions. A first height H1 of the first insulation layer 130 extending in the y-direction is substantially the same as the first depth D1 of the first trench 131 and a second height H2 of the insulation layer structure 130 extending in the x-direction is substantially the same as the second depth D2 of the second trench 135. Accordingly, the first height H1 of the insulation layer structure 130 may be higher than the second height H2 of the insulation layer structure 130.

The third semiconductor layers 123 of the conductive structure 120 are spaced apart from each other in the y-direction, and may each operate as a first electrode of a p-n junction diode. The first semiconductor layer 118 extending in the y-direction may operate as a second electrode of the p-n junction diode. The second semiconductor layer 122 may operate as a depletion region between the first semiconductor layer 118 and the third semiconductor layer 123. Also, the first semiconductor layer 118 may operate as a word line (corresponds to the word line WL of FIG. 1) extending in the y-direction.

An ohmic layer pattern 142, a lower electrode 144, and a phase change material layer pattern 146 are sequentially stacked on the third semiconductor layer 123. A third insulation layer 150 surrounding side walls of the ohmic layer pattern 142, the lower electrode 144, and the phase change material layer pattern 146 is formed on the first and second insulation layers 132 and 136. An upper electrode 148 extending in the x-direction and a bit line 152 are sequentially stacked on the phase change material layer pattern 146 and the third insulation layer 150. The ohmic layer pattern 142, the lower electrode 144, the phase change material layer pattern 146, and the upper electrode 148 may form the phase change memory unit 140, and the phase change memory unit 140 may correspond to one of the unit cells U of FIG. 1.

The semiconductor device 100 includes the plurality of conductive structures 120 arranged on the substrate 110, and the conductive structures 120 each include the first to third semiconductor layers 118, 122 and 123 including single crystal semiconductor layers. As the first and second semiconductor layers 118 and 122 extend in the y-direction, and the third semiconductor layers 123 are spaced apart in the y-direction, the conductive structure 120 may form a plurality of p-n junction diode sharing the first semiconductor layer 118 as a word line. Because the semiconductor device 100 includes the conductive structure 120 including the single crystal semiconductor layer, the semiconductor device 100 may have desirable electrical characteristics.

FIGS. 4A through 4G are perspective views for describing a method of manufacturing a semiconductor device, according to example embodiments of the inventive concepts.

Figure 4A:
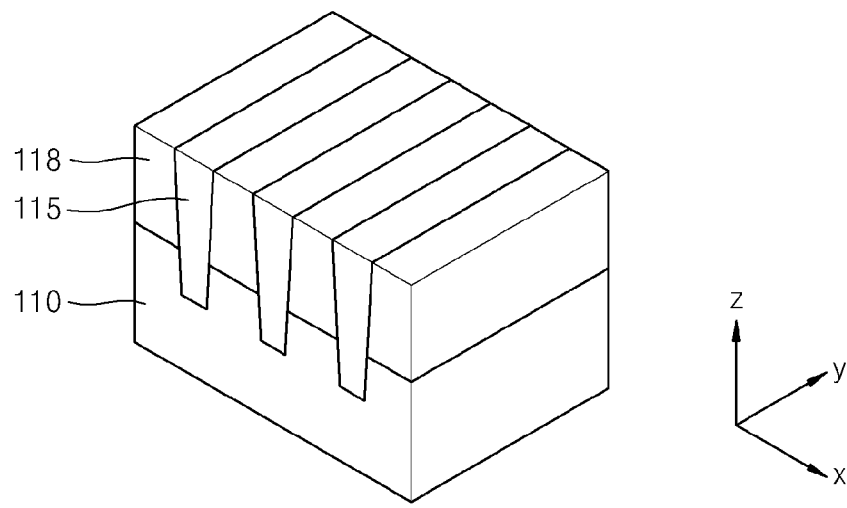
FIGS. 4A through 4G are perspective views for describing a method of manufacturing a semiconductor device, according to example embodiments of the inventive concepts.

Referring to FIG. 4A, a plurality of isolation layers 115 extending in a first direction (a y-direction of FIG. 4A) and defining an active region are formed on a substrate 110. The isolation layer 115 may be formed as impurities in a shallow trench isolation (STI) process. The isolation layer 115 may be formed of a silicon oxide. The active region extends in the y-direction. A top surface of the isolation layer 115 may be on the same plane as a top surface of the substrate 110, or lower than the top surface of the substrate 110.

A first semiconductor layer 118 may be formed on the active region of the substrate 110. The first semiconductor layer 118 may be separated by the isolation layer 115, and extend in the y-direction. A bottom surface of the first semiconductor layer 118 may be formed higher than a bottom surface of the isolation layer 115, and thus, the isolation layer 115 may separate the adjacent first semiconductor layers 110. According to example embodiments, the first semiconductor layer 118 may be formed by implanting first impurities having a first conductivity type into the active region. For example, the first impurities may be n-type impurities, e.g., P, As, Sb, or Bi. According to example embodiments, impurity concentration of the first semiconductor layer 118 may be from $1 \times 10^{20}$ to $1 \times 10^{22}$ ion/cm$^3$.

Figure 4B:
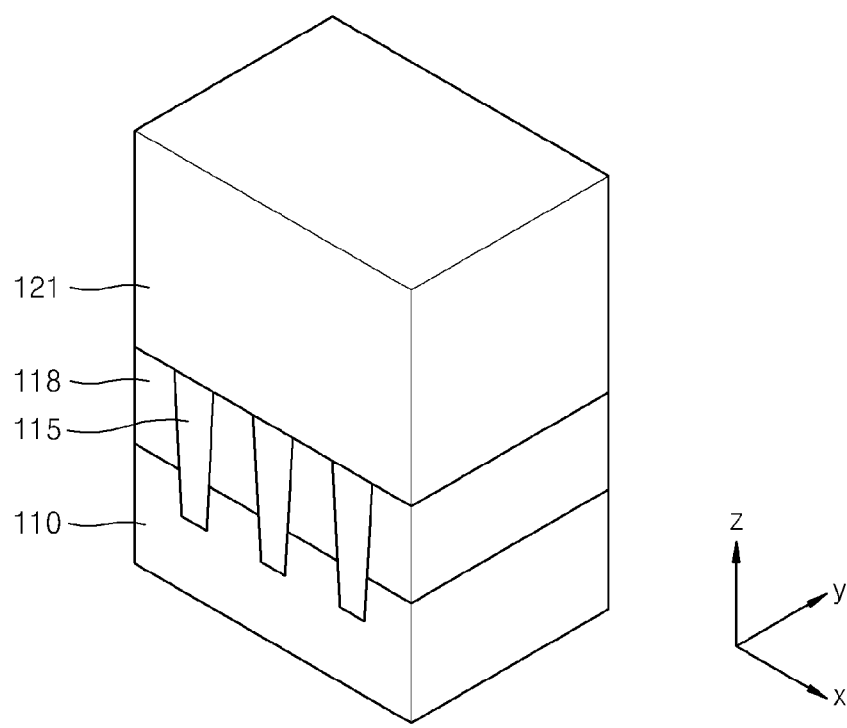

Referring to FIG. 4B, a preliminary semiconductor layer 121 may be grown from an exposed top of the first semiconductor layer 118 by performing a selective epitaxial growth (SEG) process using the top surface of the first semiconductor layer 118 as a seed layer. The preliminary semiconductor layer 121 may cover the top surface of the isolation layer 115 and extend to a given (or, alternatively predetermined) height from the top surface of the substrate 110. The preliminary semiconductor layer 121 may be a semiconductor layer formed of silicon, germanium, or silicon-germanium. For example, when the substrate 110 includes single crystal silicon, the preliminary semiconductor layer 121 may grow to form an epitaxial layer of silicon, germanium, or silicon-germanium. The preliminary semiconductor layer 121 may have a same crystalline direction as the first semiconductor layer 118. For example, when the first semiconductor layer 118 has a crystalline direction parallel to a crystallographic direction (001) of silicon, the preliminary semiconductor layer 121 may also have a crystalline direction parallel to the (001) direction of silicon.

The SEG process may be performed by a chemical vapor deposition (CVD) process. For example, the SEG process may be performed at a temperature from about 700° C. to about 900° C. under a pressure from about 10 torr to about 50 torr. Examples of the CVD process include a reduced pressure CVD (RPCVD) process, a low pressure CVD (LPCVD) process, an ultra high vacuum CVD (UHV-CVD) process, and a metal organic CVD (MOCVD) process. Hereinafter, for convenience of description, the substrate 110 includes single crystal silicon, and a single crystal silicon epitaxial layer is grown on the substrate 110.

As the first semiconductor layer 118 is formed inside the substrate 110 and the top surface of the first semiconductor layer 119 is formed on the same level as the top surface of the substrate 110, the preliminary semiconductor layer 121 may have a given (or, alternatively predetermined) height from the top surface of the substrate 110. Meanwhile, as an epitaxial layer grows from the surface of the substrate 110 in 3-dimensional (3D) manner, the epitaxial layers grown from the adjacent active regions separated by the isolation layer 115 may be connected to each other on the isolation layer 115. Accordingly, the preliminary semiconductor layer 121 covers the top of the isolation layer 115, and grows on an entire top surface of the substrate 110 in a third direction (z-direction of FIG. 4B) perpendicular to the top surface of the substrate 110. Because the epitaxial layer grows on the entire top surface of the substrate 110, a growth speed of the preliminary semiconductor layer 121 may be high, and the preliminary semiconductor layer 121 may be grown at a relatively low temperature. Also, a defect, e.g., a stacking fault, at an interface of an epitaxial layer and an insulation layer, which may occur when the epitaxial layer is formed in an opening of the insulation layer, may be prevented or inhibited, and crystallinity of the preliminary semiconductor layer 121 may be improved.

Meanwhile, a process of implanting second impurities into the preliminary semiconductor layer 121 may be further performed. The second impurities may have the first conductivity type the same as that of the first impurities. Impurity concentration of the preliminary semiconductor layer 121 may be lower than that of the first semiconductor layer 118. The second impurities may be n-type impurities, e.g., P, As, Sb, or Bi.

Figure 4C:
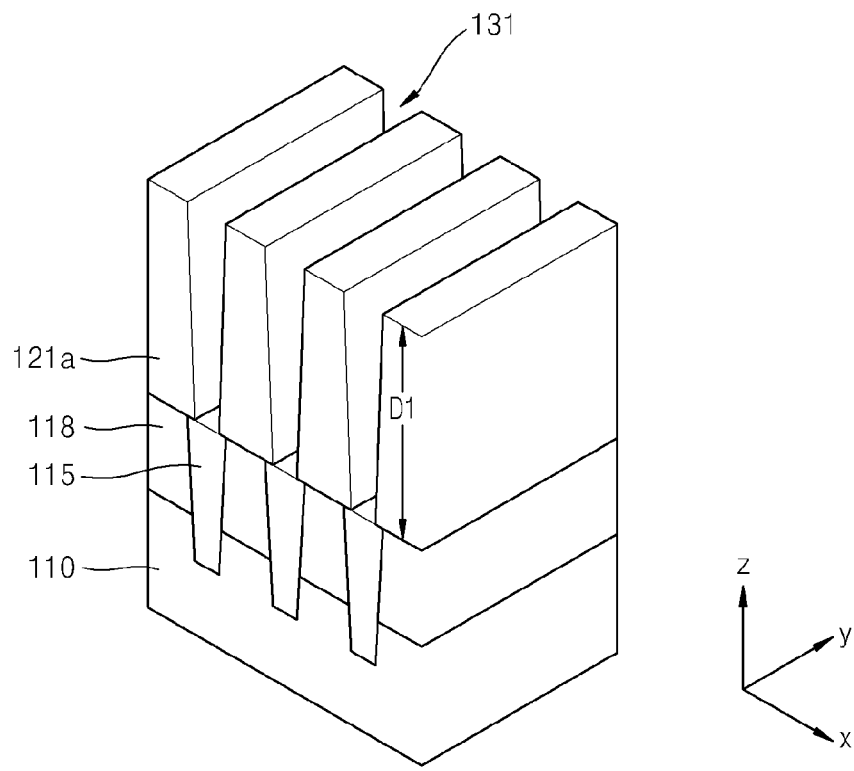

Referring to FIG. 4C, the isolation layer 115 is exposed by forming a plurality of first trenches 131 on the preliminary semiconductor layer 121 of FIG. 4B. The first trenches 131 may extend in the y-direction along an extending direction of the isolation layer 115. The first trenches 131 have a first depth D1, and may have a height substantially the same or higher than that of the preliminary semiconductor layer 121. The preliminary semiconductor layer 121 may be separated into a plurality of semiconductor layer patterns 121*a* extending in the y-direction by the first trenches 131.

According to example embodiments, a mask pattern (not shown) extending in the y-direction is formed on the preliminary semiconductor layer 121, and then the preliminary semiconductor layer 121 may be anisotropically etched until the top surface of the isolation layer 115 is exposed using the mask pattern as an etch mask, thereby forming a semiconductor layer pattern 121*a*.

Figure 4D:
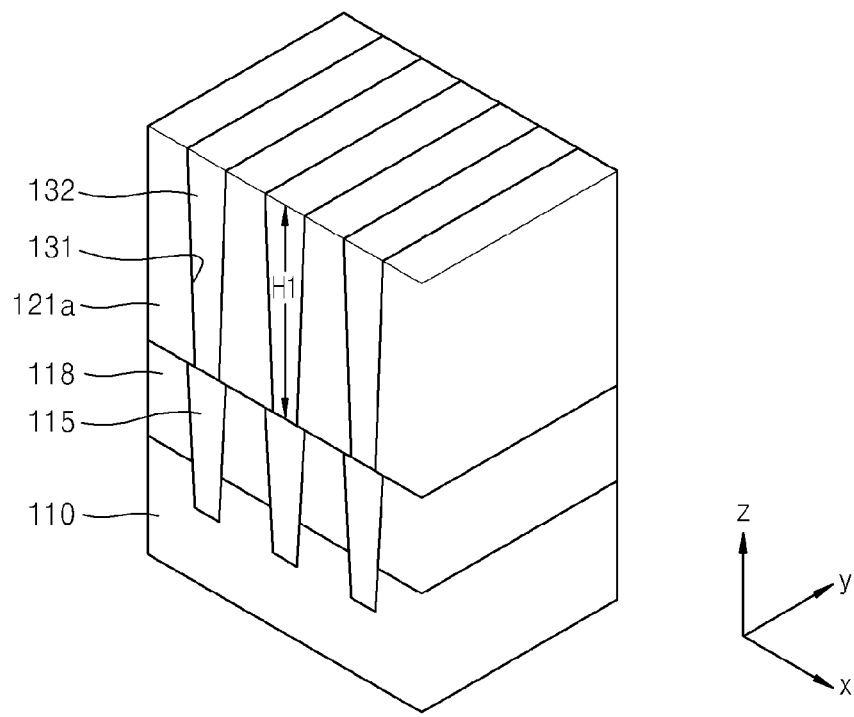

Referring to FIG. 4D, a first insulation layer 132 filling the first trenches 131 may be formed on the isolation layer 115 and side walls of the semiconductor layer patterns 121*a*. According to example embodiments, the first insulation layer 132 filling the first trenches 131 may be formed on the side walls of the semiconductor layer pattern 121*a*, and then the first insulation layer 132 may be planarized until top surfaces of the semiconductor layer patterns 121*a* are exposed.

According to example embodiments, the first insulation layer 132 may be formed by a CVD process or an atomic layer deposition (ALD) process using a silicon oxide, a silicon nitride, a silicon oxynitride, or a combination thereof. The planarization process may be performed by a chemical mechanical polishing (CMP) process or an etch-back process.

The first insulation layer 132 may extend in the y-direction between the adjacent semiconductor layer patterns 121*a*, and the top surface of the first insulation layer 132 may be formed on the same plane as the top surface of the semiconductor layer pattern 121*a*. A first height H1 of the first insulation layer 132 may be substantially the same as the first depth D1 of the first trench 131.

Figure 4E:
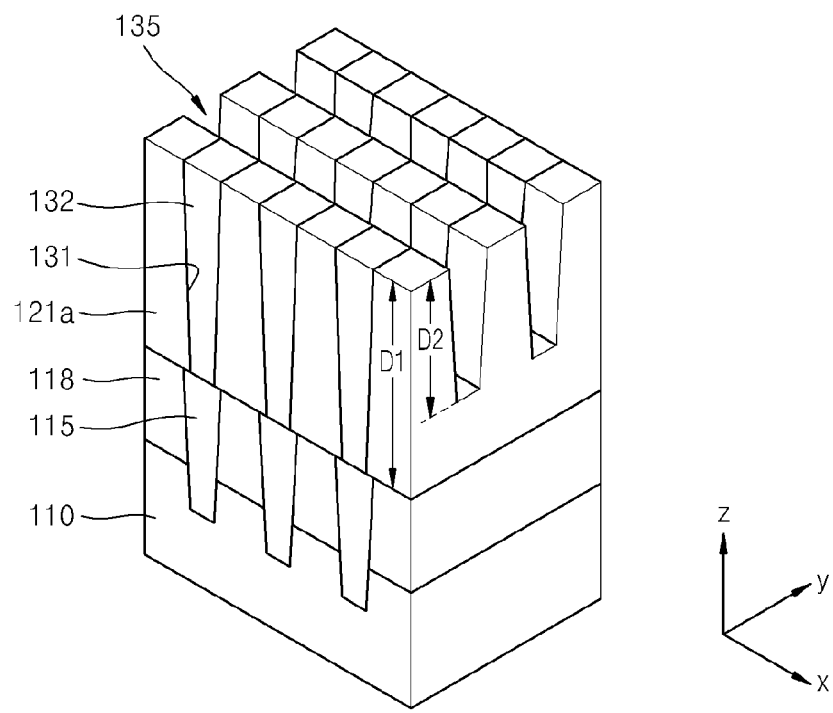

Referring to FIG. 4E, a plurality of second trenches 135 extending in the second direction (x-direction of FIG. 4E) having a given (or, alternatively predetermined) angle with the first direction is formed on the semiconductor layer patterns 121*a* and the first insulation layer 132. According to example embodiments, a mask pattern (not shown) extending in the x-direction may be formed on the semiconductor layer pattern 121*a* and the first insulation layer 132, and then the semiconductor layer pattern 121*a* and the first insulation layer 132 may be anisotropically etched using the mask pattern as an etch mask. The second trenches 135 may have a second depth D2 that is smaller than the first depth D1 of the first trench 131. Accordingly, the second trench 135 may not expose the top surface of the isolation layer 115.

Because the second trenches 135 are formed to have the second depth D2 from the top of the semiconductor layer pattern 121*a*, the tops of the semiconductor layer patterns 121*a* may be spaced apart from each other in the y-direction and the bottoms of the semiconductor layer patterns 121*a* may extend in the y-direction. Also, because the top surface of the first insulation layer 132 is formed substantially on the same level as the top surface of the semiconductor layer pattern 121*a*, the second trenches 135 may be formed to have substantially the same depth as the second depth D2 from the top surface of the first insulation layer 132. Accordingly, the tops of the first insulation layers 132 may be spaced apart from each other in the y-direction and the bottoms of the first insulation layer 132 may extend in the y-direction. For example, the first insulation layer 132 may substantially have the same shape as the semiconductor layer pattern 121*a* between the adjacent semiconductor layer patterns 121*a*.

Figure 4F:
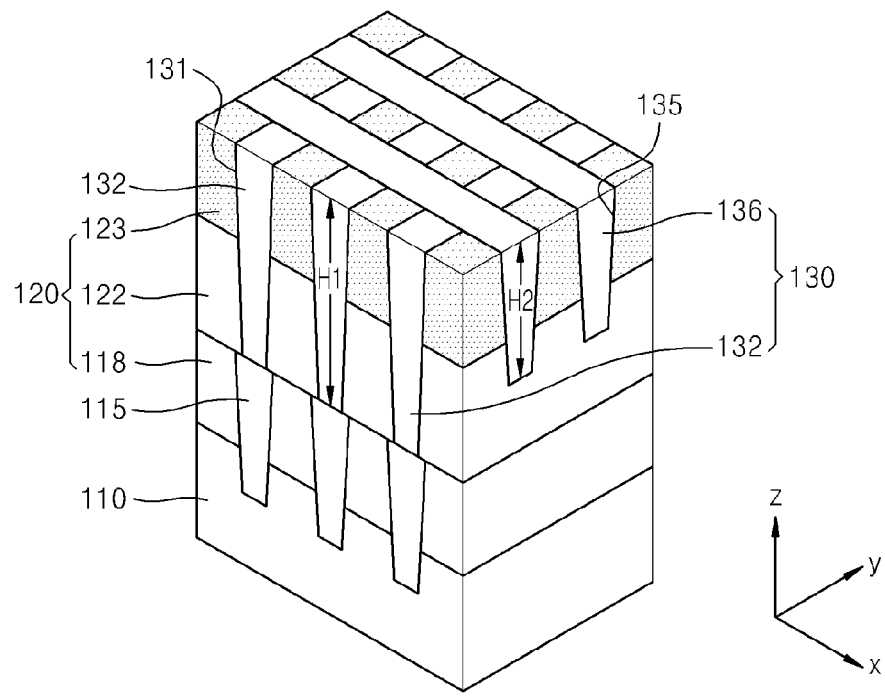

Referring to FIG. 4F, a second insulation layer 136 extending in the x-direction is formed on side walls and bottoms of the semiconductor layer pattern 121*a* of FIG. 4E and the first insulation layer 132, which are exposed by the second trench 135. According to example embodiments, the second insulation layer 136 filling the second trench 135 may be formed on the semiconductor layer pattern 121*a* and the first insulation layer 132, and then the top of the second insulation layer 136 may be planarized until the top surface of the semiconductor layer pattern 121*a* is exposed. According to example embodiments, the second insulation layer 136 may be formed by a CVD or ALD process using a silicon oxide, a silicon nitride, a silicon oxynitride, or a combination thereof.

According to example embodiments, the top surface of the second insulation layer 136 may be formed substantially on the same level as the top surface of the semiconductor layer pattern 121*a*. A second height H2 of the second insulation layer 136 may be smaller than the first height H1 of the first insulation layer 132. Accordingly, the second insulation layer 136 may have a shape crossing the first insulation layer 132. The second insulation layer 136 may be formed at a region where the first and second trenches 131 and 135 cross each other. The first and second insulation layers 132 and 136 may be defined as an insulation layer structure 130.

An ion implantation process is performed on the tops of the semiconductor layer patterns 121a spaced apart by the second trench 135, thereby forming a plurality of third semiconductor layer 123 including third impurities at an upper portion of the semiconductor layer patterns 121a. A bottom surface of the third semiconductor layer 123 may be formed to have a higher level than a bottom surface of the second trench 135. Accordingly, the plurality of third semiconductor layers 123 may be formed to be spaced apart from each other in the y-direction. The third impurities may have a second conductivity type, and the third impurities may be p-type impurities, e.g., B, Ga, or In.

Here, a lower portion of the semiconductor layer pattern 121a below the third semiconductor layer 123 is defined as the second semiconductor layer 122. Accordingly, a plurality of conductive structures 120, each including the first semiconductor layer 118, the second semiconductor layer 122, and the plurality of third semiconductor layers 123, which are sequentially stacked on the substrate 110, are formed. The first semiconductor layers 118 extend in the y-direction, and are separated by the isolation layer 115. The third semiconductor layers 123 are spaced apart from each other in the y-direction by the first and second insulation layers 132 and 136. Each second semiconductor layer 122 is formed between the first semiconductor layer 118 and the third semiconductor layers 123. The bottoms of the second semiconductor layers 122 extend in the y-direction between the first insulation layers 132, and the tops of the second semiconductor layers 122 are spaced apart from each other in the y- and x-directions by the first and second insulation layers 132 and 136. The first semiconductor layer 118 operates as an n-type semiconductor layer, the third semiconductor layer 123 operates as a p-type semiconductor layer, the second semiconductor layer 122 may operate as a depletion region, and the conductive structure 120 may operate as a p-n junction diode.

Figure 4G:
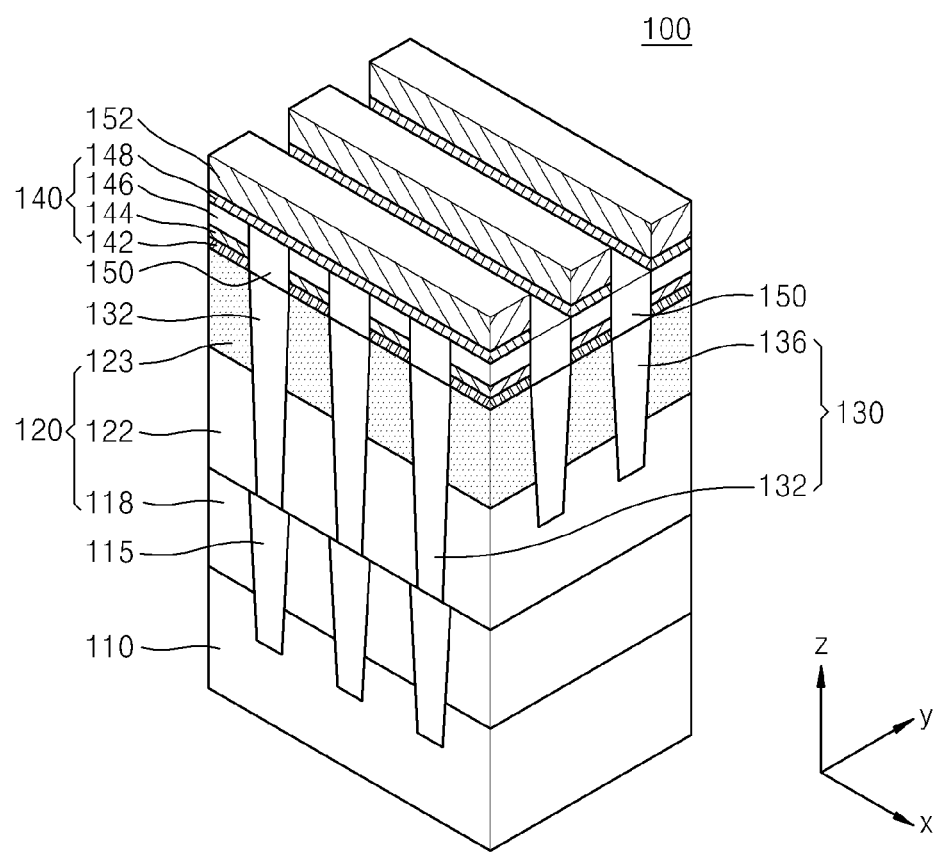

Referring to FIG. 4G, an ohmic layer (not shown), a lower electrode layer (not shown), and a phase change material layer (not shown) may be sequentially formed on the third semiconductor layer 123 and the first and second insulation layers 132 and 136, and then the phase change material layer, the lower electrode layer, and the ohmic layer may be patterned so as to form an ohmic layer pattern 142, a lower electrode 144, and a phase change material layer pattern 146 sequentially stacked on the third semiconductor layer 123.

The ohmic layer may be formed using metal silicide, e.g., tungsten silicide, nickel silicide, or cobalt silicide. The lower electrode layer may be formed using a metal having a high melting point, a combination thereof, or a nitride thereof e.g., TiN, TiSiN, TiAlN, TaSiN, TaAlN, TaN, WSi, WN, TiW, MoN, NbN, TiBN, ZrSiN, WSiN, WBN, ZrAlN, MoAlN, TiAl, TiON, TiAlON, WON, or TaON. The phase change material layer may be formed using a chalcogenide compound, e.g., GeSbTe, GeTeAs, GeBiTe, GeTeTi, GeTeSe, AsSbTe, AsGeSbTe, SnSbTe, SeTeSn, SnSbBi, GaTeSe, InSbTe, GeTe, SbTe, InSnSbTe, or AgInSbTe, or the chalcogenide compound doped with impurities. The chalcogenide compound is doped with impurities that may be a nitrogen (N), oxygen (O), silicon (Si) carbon (C), boron (B), dysprosium (Dy), or a combination thereof.

Although not shown in FIG. 4G, a barrier layer (not shown) may be further formed after forming the ohmic layer. The barrier layer may be formed using tungsten or tungsten titanium. The barrier layer may prevent or inhibit an unwanted reaction, e.g., silicification of the lower electrode layer, which may be generated at an interface of the ohmic layer and the lower electrode layer.

A third insulation layer 150 surrounding side walls of the ohmic layer pattern 142, lower electrode 144, and phase change material layer pattern 146 is formed on the first and second insulation layers 132 and 136. According to example embodiments, the third insulation layer 150 covering the ohmic layer pattern 142, the lower electrode 144, and the phase change material layer pattern 146 may be formed on the first and second insulation layers 132 and 136, and the top of the third insulation layer 150 may be planarized until a top surface of the phase change material layer pattern 146 is exposed.

An upper electrode 148 extending in the x-direction is formed on the phase change material layer pattern 146 and the third insulation layer 150. In FIG. 4G, the upper electrode 148 extends in the x-direction while being connected to each of the phase change material layer patterns 146 spaced apart in the x-direction, but alternatively, the upper electrodes 148 may be respectively formed on the phase change material layer pattern 146, and spaced apart from each other in the x-direction. The upper electrode 148 may be formed using a metal having a high melting point or a nitride thereof, e.g., TiN, TiSiN, TiAlN, TaSiN, TaAlN, TaN, WSi, WN, TiW, MoN, NbN, TiBN, ZrSiN, WSiN, WBN, ZrAlN, MoAlN, TiAl, TiON, TiAlON, WON, or TaON. Accordingly, a phase change memory unit 140 including the ohmic layer pattern 142, the lower electrode 144, the phase change material layer pattern 146, and the upper electrode 148 may be formed. A bit line 152 extending in the x-direction is formed on the upper electrode 148. The semiconductor device 100 is completed by performing the above processes.

According to the semiconductor device 100, the preliminary semiconductor layer 121 including the single crystal silicon epitaxial layer is formed by performing the SEG process, and then the conductive structure 120 is formed by etching the preliminary semiconductor layer 121 in the x- and y-directions. The conductive structure 120 has desirable crystallinity and may prevent or inhibit a defect from occurring. Thus, the semiconductor device 100 including the conductive structure 120 has desirable electrical characteristics.

FIGS. 5A through 5F are perspective views for describing a method of manufacturing a semiconductor device 200, according to example embodiments of the inventive concepts.

Figure 5A:
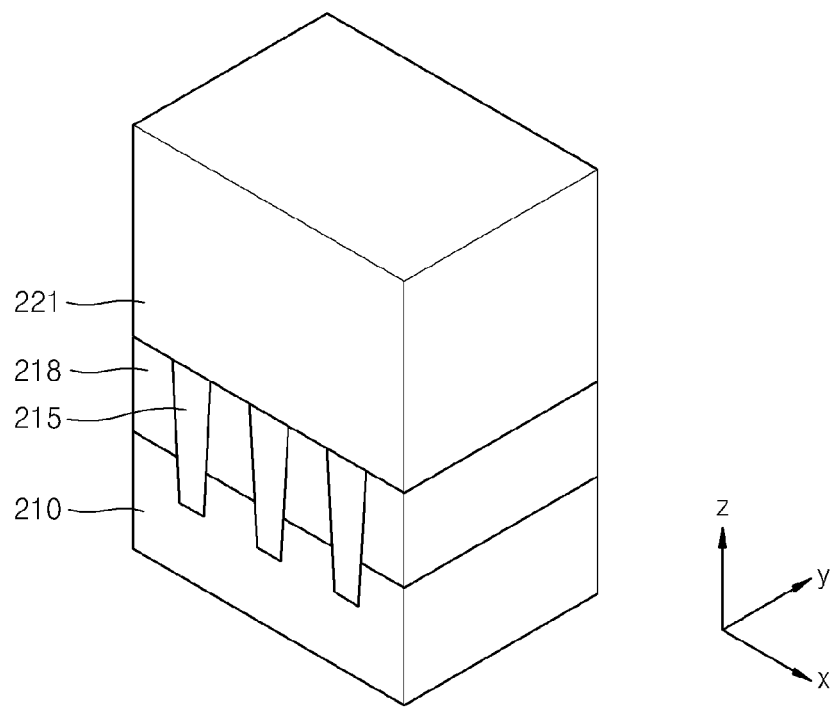
FIGS. 5A through 5F are perspective views for describing a method of manufacturing a semiconductor device, according to example embodiments of the inventive concepts.

Referring to FIG. 5A, a plurality of isolation layers 215 extending in a first direction (y-direction of FIG. 5A) and defining an active region are formed on a substrate 210. A first semiconductor layer 218 may be formed in the active region on the substrate 210. According to example embodiments, the first semiconductor layer 218 may be formed by implanting first impurities having a first conductivity type into the active region.

A preliminary semiconductor layer 221 is grown from an exposed top surface of the first semiconductor layer 218 by performing an SEG process by a top surface of the first semiconductor layer 218 as a seed layer. As an epitaxial layer grows from a surface of the substrate 210 in 3D, the epitaxial layers grown from the adjacent active regions separated by the isolation layer 215 may be connected to each other at a top of the isolation layer 215. Accordingly, the preliminary semiconductor layer 221 may be formed on the substrate 210 and the isolation layer 215.

A process of implanting second impurities having the first conductivity type into the preliminary semiconductor layer 221 may be further performed.

Figure 5B:
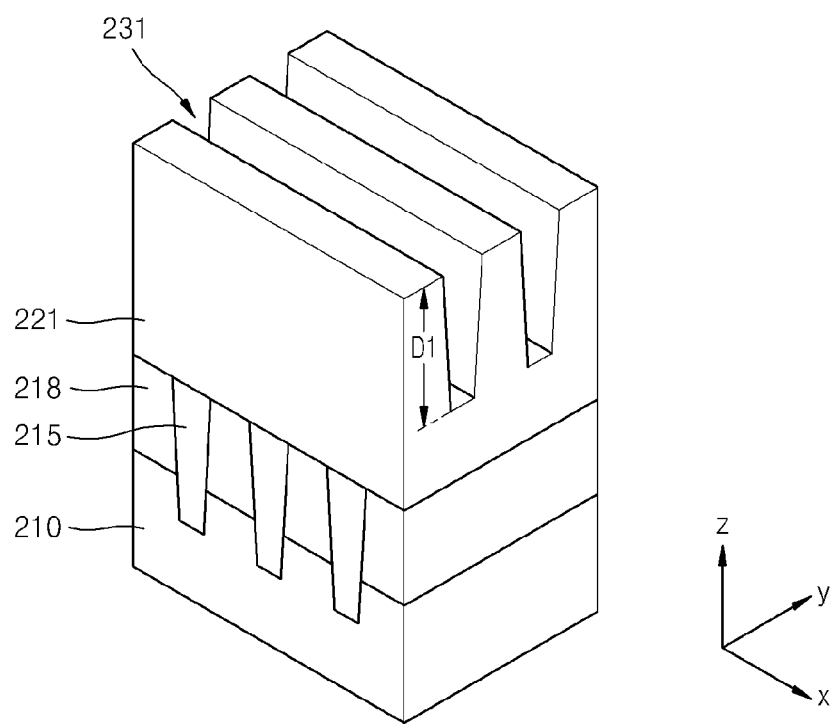

Referring to FIG. 5B, a plurality of first trenches 231 extending in a second direction (x-direction of FIG. 5B) having a given (or, alternatively predetermined) angle with the first direction are formed on the preliminary semiconductor layer 221. The first trenches 231 have a first depth D1, and the first depth D1 may be lower than a height of the preliminary semiconductor layer 221. Also, the top surface of the substrate 210 and the top surface of the isolation layer 215 may not be exposed.

Figure 5C:
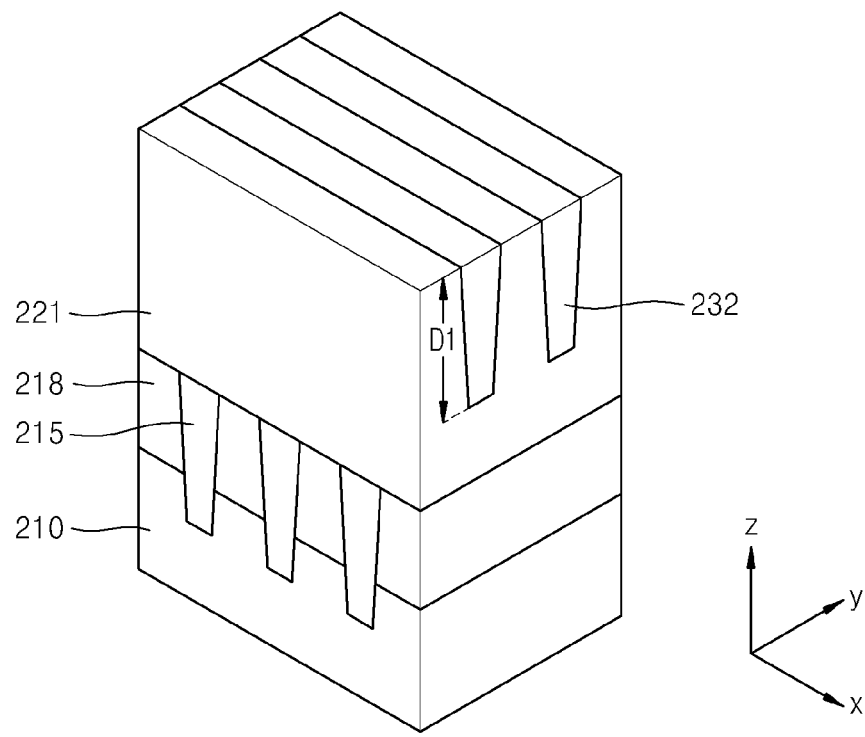

Referring to FIG. 5C, a first insulation layer 232 is formed on side walls of the preliminary semiconductor layer 221 exposed by the first trench 231. According to example embodiments, after forming the first insulation layer 232 filling the first trench 231 on the side walls of the preliminary semiconductor layer 221, the first insulation layer 232 may be planarized until a top surface of the preliminary semiconductor layer 221 is exposed. According to example embodiments, because a top surface of the first insulation layer 232 is substantially on the same level as the top surface of the preliminary semiconductor layer 221, and the first insulation layer 232 is formed inside the first trench 231, the first insulation layer 232 may have the same height as the first depth D1 of the first trench 231. The first insulation layer 232 may extend in the x-direction.

Figure 5D:
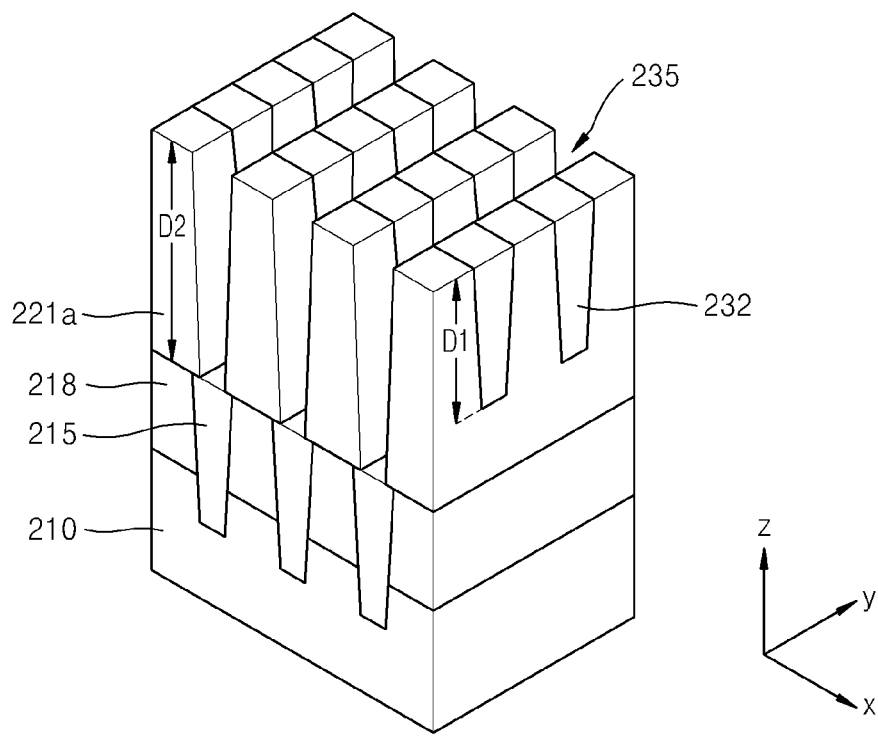

Referring to FIG. 5D, the isolation layer 215 is exposed by forming a plurality of second trenches 235 extending in a y-direction on the preliminary semiconductor layer 221 and the first insulation layer 232. The second trench 235 has the second depth D2, and the second depth D2 may have the same or higher height than the preliminary semiconductor layer 221. Accordingly, the second trench 235 may expose a top surface of the isolation layer 215, and separate the preliminary semiconductor layer 221 into a plurality of semiconductor layer patterns 221a. The semiconductor layer patterns 221a may extend in the y-direction, and be separated from each other in the x-direction. The first insulation layer 232 extending in the x-direction may be separated by the second trench 235 to form a plurality of island shapes.

Meanwhile, the semiconductor layer pattern 221a may tilt or fall while separating the semiconductor layer pattern 221a by etching the preliminary semiconductor layer 221 when the height of the preliminary semiconductor layer 221 is too high. However, when the semiconductor layer pattern 221a is separated by etching the preliminary semiconductor layer 221 after the first insulation layer 232 filling the first trench 231 is formed, structural stability may be improved due to the first insulation layer 232, and thus tilting or falling of the semiconductor layer pattern 221a may be avoided.

Figure 5E:
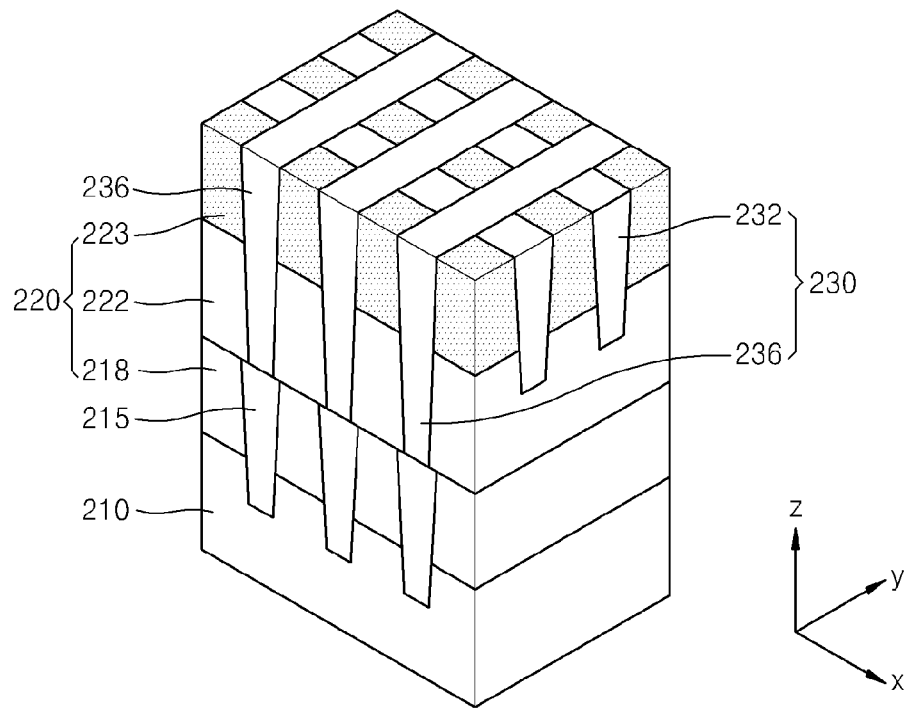

Referring to FIG. 5E, a second insulation layer 236 is formed on the isolation layer 215, and side walls of the semiconductor layer pattern 221a of FIG. 5D and first insulation layer 232, which are exposed by the second trench 235 of FIG. 5D. The top surface of the second insulation layer 236 may be formed substantially on the same level as the top surface of the semiconductor layer pattern 221a. A height of the second insulation layer 236 may be higher than a height of the first insulation layer 232. The second insulation layer 236 may be formed to cross the first insulation layer 232. The second insulation layer 236 may be formed at a region where the first trench 231 of FIG. 5D and the second trench 235 cross each other. The first and second insulation layers 232 and 236 may be defined as an insulation layer structure 230.

A third semiconductor layer 223 including third impurities may be formed by performing an ion implantation process on the top of the semiconductor layer pattern 221a. The third impurities may have a second conductivity type that is different from the first conductivity type. The third semiconductor layers 223 may be spaced apart from each other in the y- and x-directions by the first and second insulation layers 232 and 236.

A portion of the semiconductor layer pattern 221a below the third semiconductor layer 223 may be defined as a second semiconductor layer 222. The first semiconductor layer 218, the second semiconductor layer 222, and the third semiconductor layer 223 sequentially formed on the substrate 210 may form a conductive structure 220.

Figure 5F:
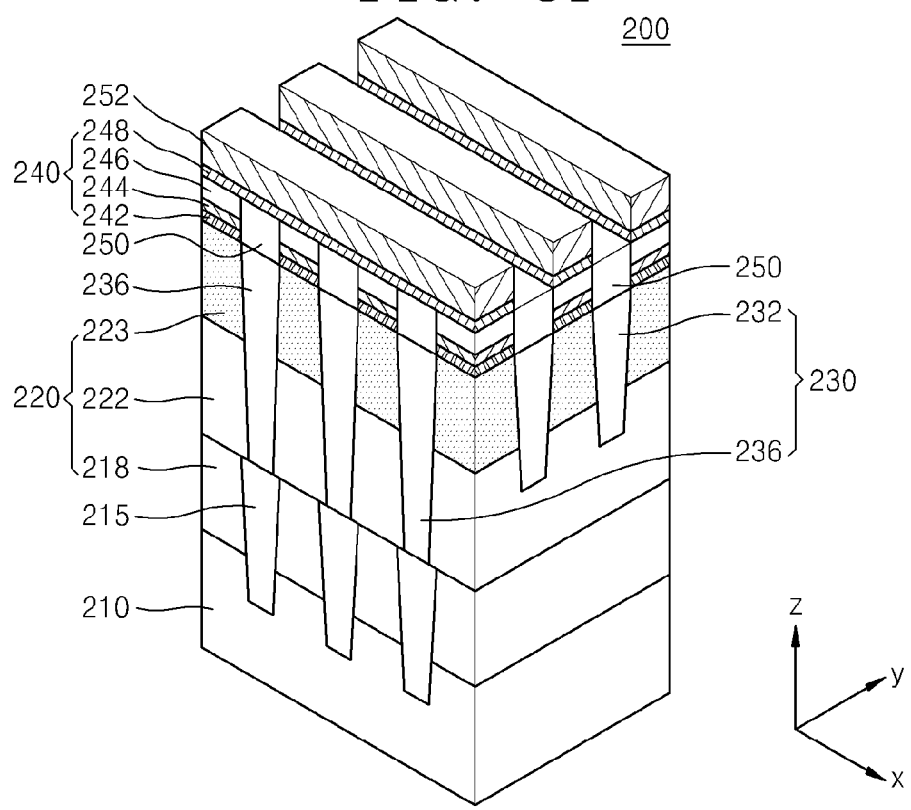

Referring to FIG. 5F, an ohmic layer (not shown), a lower electrode layer (not shown), and a phase change material layer (not shown) are sequentially formed on the third semiconductor layer 223 and the first and second insulation layers 232 and 236, and then an ohmic layer pattern 242, a lower electrode 244, and a phase change material layer pattern 246 are sequentially stacked on the third semiconductor layer 223 are formed by patterning the phase change material layer, the lower electrode layer, and the ohmic layer. A third insulation layer 250 surrounding side walls of the ohmic layer pattern 242, a lower electrode 244, and a phase change material layer pattern 246 is formed on the first and second insulation layers 232 and 236. An upper electrode 248 and a bit line 252, which extend in the x-direction, are sequentially formed on the phase change material layer pattern 246 and the third insulation layer 250. Accordingly, a phase change memory unit 240 including the ohmic layer pattern 242, the lower electrode 244, the phase change material layer pattern 246, and the upper electrode 248 may be formed on the plurality of conductive structures 220.

The semiconductor device 200 is completed by performing the above processes.

FIGS. 6A through 6E are perspective views for describing a method of manufacturing a semiconductor device 300, according to example embodiments of the inventive concepts.

Figure 6A:
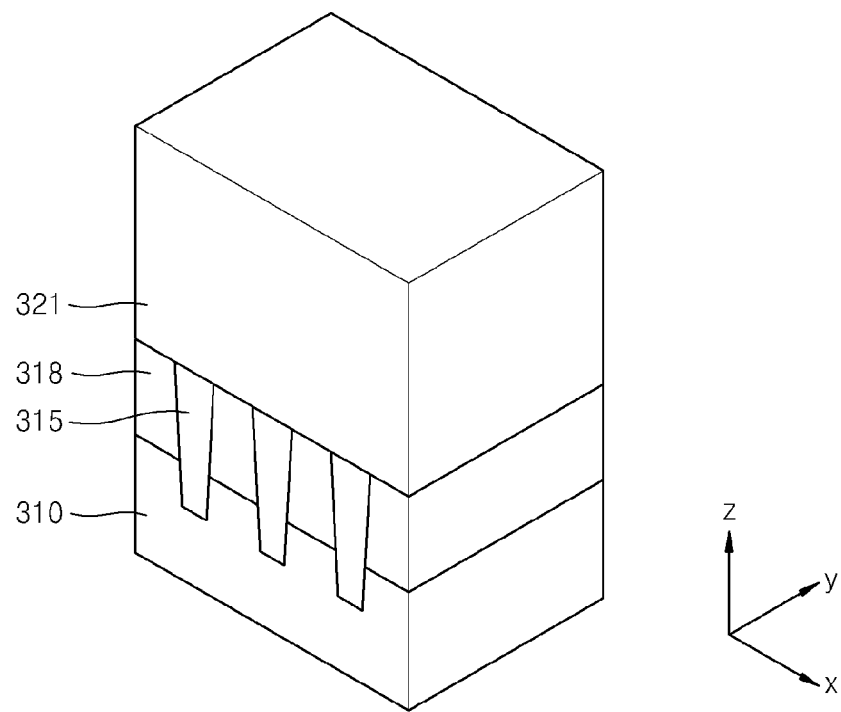
FIGS. 6A through 6E are perspective views for describing a method of manufacturing a semiconductor device, according to example embodiments of the inventive concepts.

Referring to FIG. 6A, a plurality of isolation layers 315 extending in a first direction (y-direction of FIG. 6A) and defining an active region are formed on a substrate 310. A first semiconductor layer 318 is formed on the substrate 310 in the active region. According to example embodiments, the first semiconductor layer 318 may be formed by implanting first impurities having a first conductivity type into the active region.

A preliminary semiconductor layer 321 is grown from an exposed top surface of the first semiconductor layer 318 by performing a SEG process by a top surface of the first semiconductor layer 318 as a seed layer. As an epitaxial layer is grown from a surface of the substrate 310 in 3D, the epitaxial layer grown from the adjacent active regions separated by the isolation layer 315 may be connected to each other at the top of the isolation layer 315. Accordingly, the preliminary semiconductor layer 321 may be formed on the substrate 310 and the isolation layer 315. A process of implanting second impurities having the first conductivity type into the preliminary semiconductor layer 321 may be further performed.

Figure 6B:
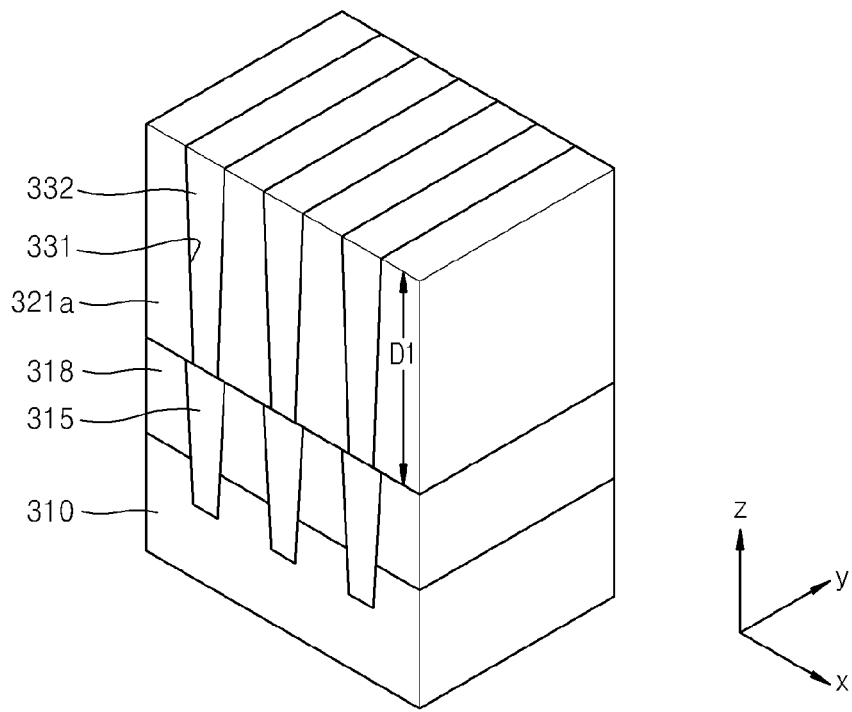

Referring to FIG. 6B, a plurality of trenches 331 extending in the y-direction are formed on the preliminary semiconductor layer 321 of FIG. 6A. The first trenches 331 may have a first depth D1, and the first depth D1 may be higher than a height of the preliminary semiconductor layer 321. The preliminary semiconductor layer 321 may be separated into a plurality of semiconductor layer patterns 321a by the first trenches 331, and a top surface of the isolation layer 315 may be exposed.

A first insulation layer 332 is formed on the isolation layer 315 and side walls of the preliminary semiconductor layer 321 exposed by the first trench 331. According to example embodiments, the first insulation layer 332 filling the first trench 331 may be formed on the side walls of the preliminary semiconductor layer 321, and then the first insulation layer 332 may be planarized until the top surface of the preliminary semiconductor layer 321 is exposed. According to example embodiments, because the top surface of the first insulation layer 332 is substantially on the same level as the top surface of the preliminary semiconductor layer 321, and the first insulation layer 332 is formed inside the first trench 331, the first insulation layer 332 may have a similar height as the first depth D1 of the first trench 331. The first insulation layer 332 may extend in the x-direction.

Figure 6C:
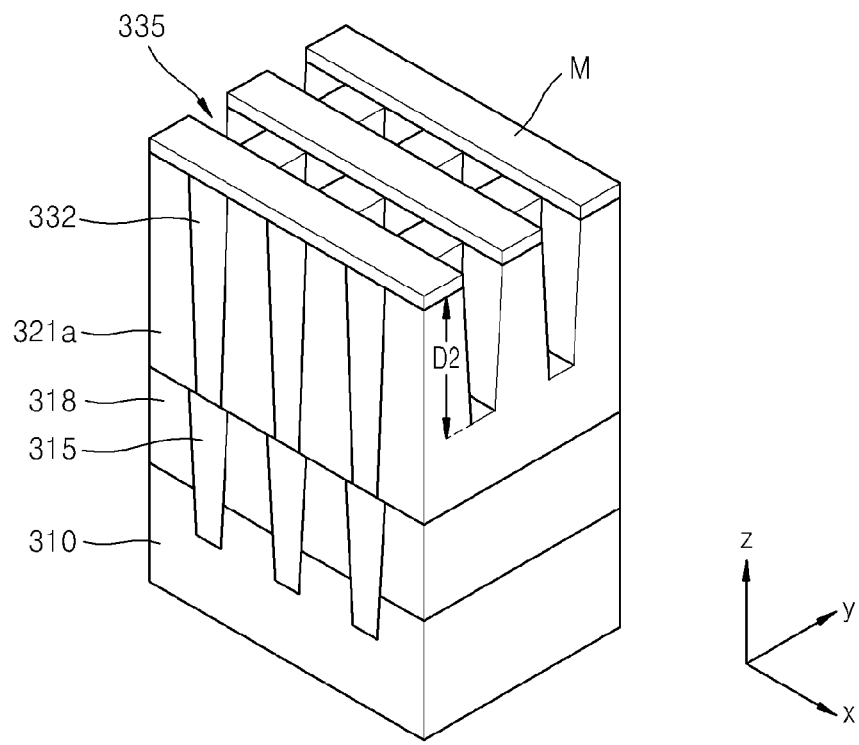

Referring to FIG. 6C, a hard mask pattern M extending in a second direction (x-direction of FIG. 6C) having a given (or, alternatively predetermined) angle with the first direction is formed on the semiconductor layer pattern 321a and the first insulation layer 332. The hard mask pattern M may be formed using a silicon oxide, a silicon nitride, a silicon carbide, a silicon oxynitride, or a combination thereof.

A top of the semiconductor layer pattern 321a not covered by the hard mask pattern M may be selectively removed using the hard mask pattern and the first insulation layer 332 as etch masks. Accordingly, an opening 335 is formed on the semiconductor layer pattern 321a. The plurality of openings 335 spaced apart from each other in the x- and y-directions may be formed as the hard mask pattern M and the first insulation layer 332 cross each other. A second depth D2 of the opening 335 may be smaller than the first depth D1 (refer to FIG. 6B) of the first trench 331. Accordingly, the tops of the semiconductor layer patterns 321a may be spaced apart from each other in the y-direction by the opening 335, and the bottoms of the semiconductor layer patterns 321a may extend in the y-direction. According to example embodiments, the selective removing process of the semiconductor layer pattern 321a may be performed by a selective etch process using an etchant having an etch selectivity on a material of the semiconductor layer pattern 321a. When the height of the preliminary semiconductor layer 321 is high, the selective etch process may be used to prevent or inhibit tilting or falling of the semiconductor layer pattern 321a, which may occur during a trench forming process. The hard mask pattern M may be removed.

Figure 6D:
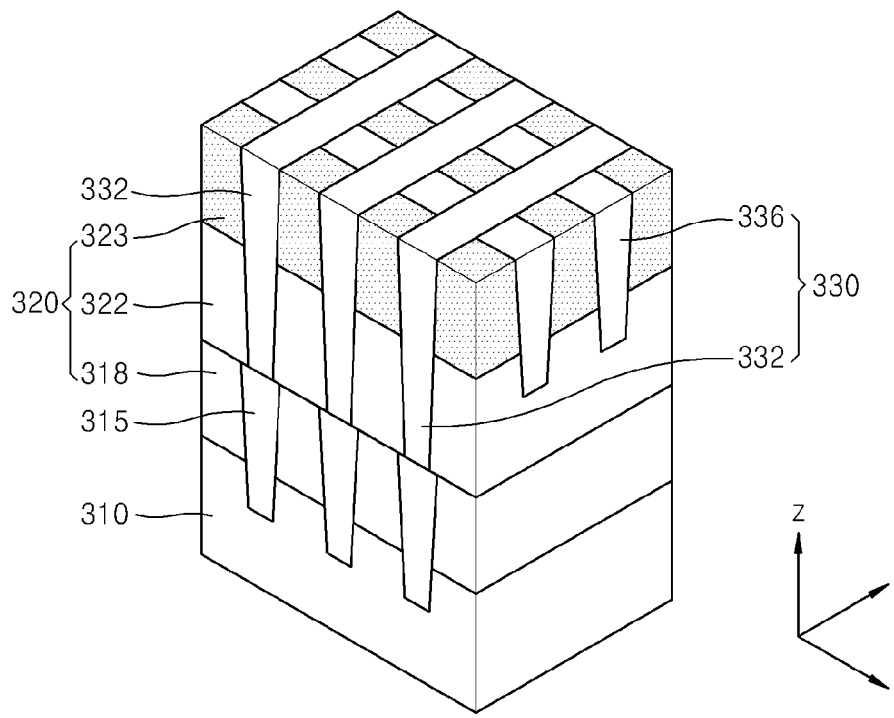

Referring to FIG. 6D, a second insulation layer 336 filling the opening 335 of FIG. 6C is formed on side walls of the semiconductor layer pattern 321a of FIG. 6C and first insulation layer 332. A top surface of the second insulation layer 336 may be formed substantially on the same level as the top surface of the semiconductor layer pattern 321a. The second insulation layer 336 may be formed to cross the first insulation layer 332. The first and second insulation layers 332 and 336 may be defined as an insulation layer structure 330.

An ion implantation process is performed on the semiconductor layer pattern 321a to form a third semiconductor layer 323 including third impurities. The third impurities may have a second conductivity type that is different from the first conductivity type. The third semiconductor layers 323 may be spaced apart in the y- and x-directions by the first and second insulation layers 332 and 336.

A portion of the semiconductor layer pattern 321a below the third semiconductor layer 323 may be defined as a second semiconductor layer 322. The first semiconductor layer 318, the second semiconductor layer 322, and the third semiconductor layer 323 sequentially formed on the substrate 310 may form a conductive structure 320.

Figure 6E:
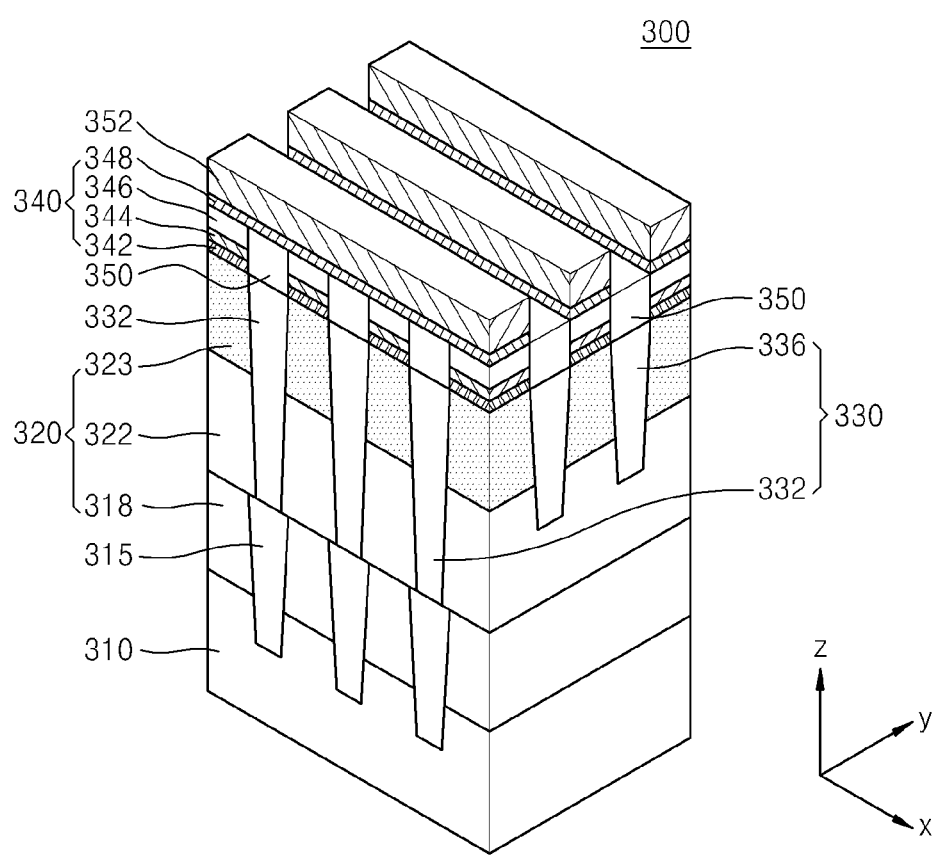

Referring to FIG. 6E, an ohmic layer (not shown), a lower electrode layer (not shown), and a phase change material layer (not shown) are sequentially formed on the third semiconductor layer 323 and the first and second insulation layers 332 and 336, and then the phase change material layer, the lower electrode layer, and the ohmic layer are patterned to form an ohmic layer pattern 342, a lower electrode 344, and a phase change material layer pattern 346 sequentially stacked on the third semiconductor layer 323. A third insulation layer 350 surrounding side walls of the ohmic layer pattern 342, lower electrode 344, and phase change material layer pattern 346 is formed on the first and second insulation layers 332 and 336. An upper electrode 348 and a bit line 352, which extend in the x-direction, are sequentially formed on the phase change material layer pattern 346 and the third insulation layer 350. Accordingly, a phase change memory unit 340 including the ohmic layer pattern 342, the lower electrode 344, the phase change material layer pattern 346, and the upper electrode 348 may be formed on the plurality of conductive structures 320.

The semiconductor device 300 is completed by performing the above processes.

FIGS. 7A through 7F are perspective views for describing a method of manufacturing a semiconductor device 400, according to example embodiments of the inventive concepts.

Figure 7A:
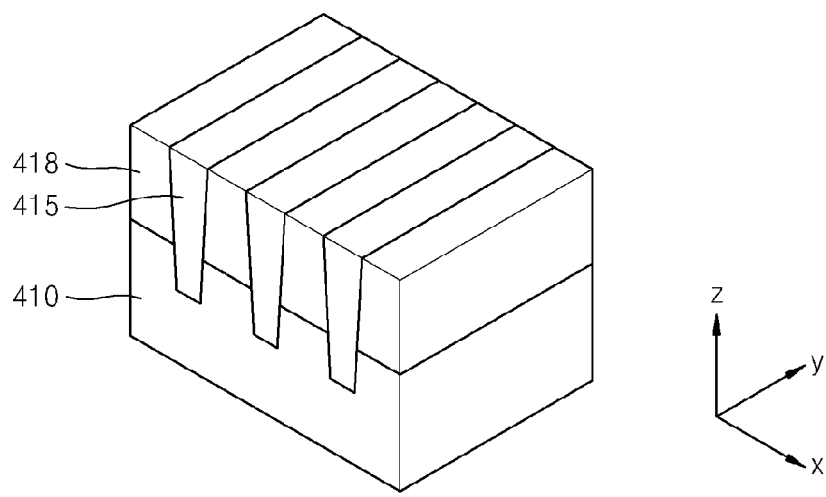
FIGS. 7A through 7F are perspective views for describing a method of manufacturing a semiconductor device, according to example embodiments of the inventive concepts.

Referring to FIG. 7A, a plurality of isolation layers 415 extending in a first direction (y-direction of FIG. 7A) and defining an active region are formed on a substrate 410. A first semiconductor layer 418 may be formed on the substrate 410 in the active region. According to example embodiments, the first semiconductor layer 418 may be formed by implanting first impurities having a first conductivity type into the active region.

Figure 7B:
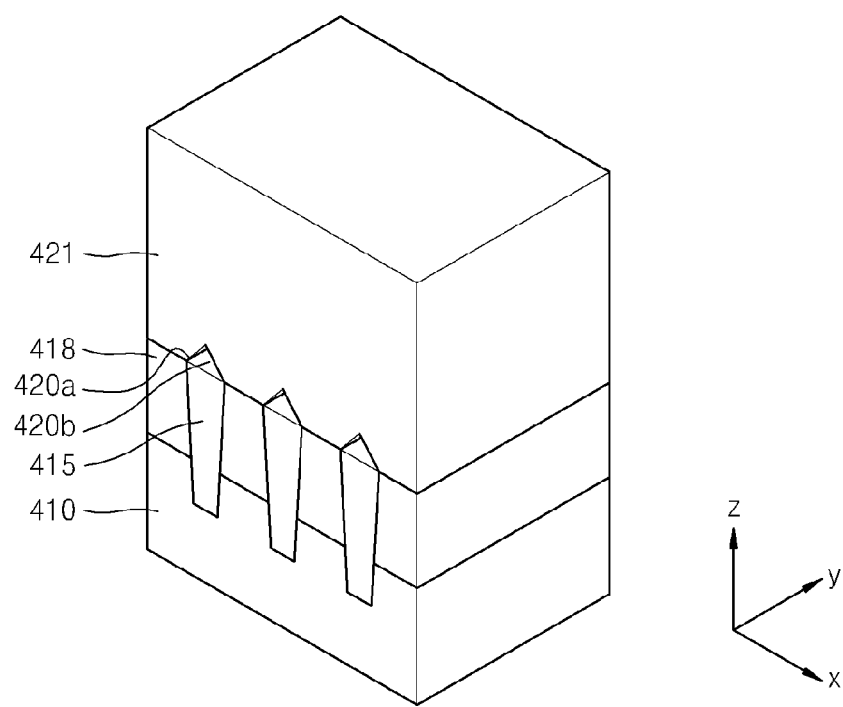

Referring to FIG. 7B, a preliminary semiconductor layer 421 is grown from an exposed top surface of the first semiconductor layer 418 by performing an SEG process using a top surface of the first semiconductor layer 418 as a seed layer.

When the SEG process is performed, an epitaxial layer is grown in 3D using a surface of the substrate 410 as a seed layer, and a growth speed of the epitaxial layer may differ according to an atomic density of a crystallographic plane of the seed layer. For example, the growth speed of the epitaxial layer is relatively high in a direction perpendicular to a crystallographic plane (001) of silicon because the atomic density of the (001) plane is low, and the growth speed is relatively low in a direction perpendicular to a crystallographic plane (111) of silicon because the atomic density of the (111) plane is high. Accordingly, the epitaxial layer formed from the substrate 410 and adjacent to the isolation layer 415 may have at least one facet 420a. When the top surface of the substrate 410 is parallel to the crystallographic plane (001), the facet 420a may be parallel to the crystallographic plane (111). For example, the facet 420a may have an angle of about 54.7° with the top surface of the substrate 410. The facets 420a grown from the top surface of the substrate 410 separated by the isolation layer 415 may be connected to each other at the top of the isolation layer 415. Accordingly, a void 420b may be formed on the isolation layer 415, and a part of the top of the isolation layer 415 may not be covered by the preliminary semiconductor layer 421.

A process of implanting second impurities having the first conductivity type into the preliminary semiconductor layer 421 may be further performed.

Figure 7C:
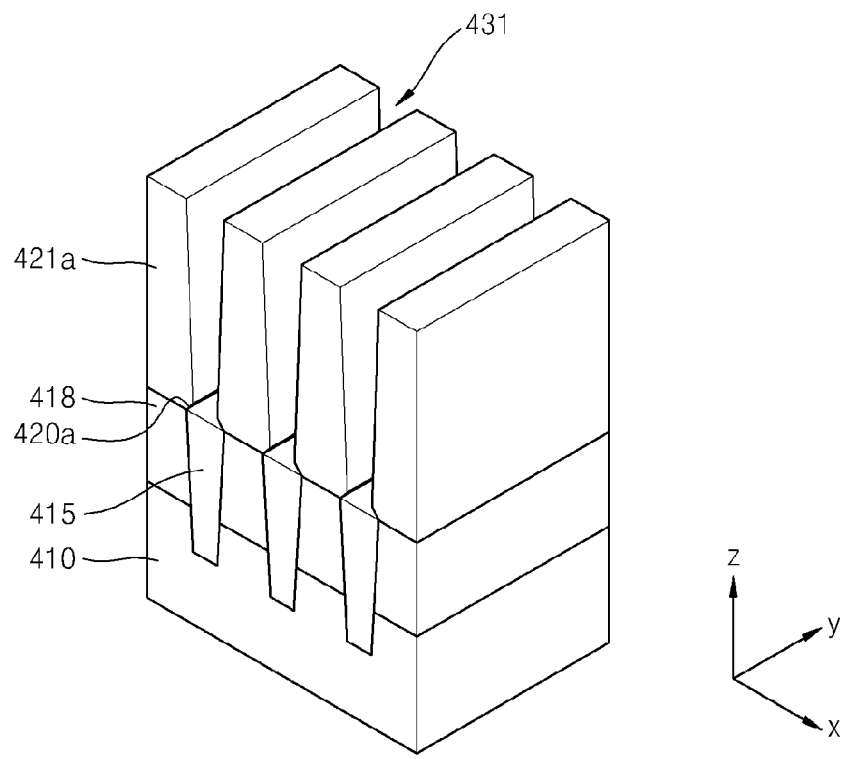

Referring to FIG. 7C, a plurality of first trenches 431 extending in a y-direction are formed on the preliminary semiconductor layer 421 of FIG. 7B. The preliminary semiconductor layer 421 is separated into a plurality of semiconductor layer patterns 421a by the first trenches 431, and the top surface of the isolation layer 415 may be exposed.

Meanwhile, while etching the preliminary semiconductor layer 421 to form the first trench 431, the etching may be stopped at a point where the first trench 431 meets the facet 420a, because the facet 420a is formed at a lower portion of the semiconductor layer pattern 421a and the part of the top surface of the isolation layer 415 is not covered. Accordingly, a part of the facet 420a may remain at a bottom portion of the first trench 431.

Meanwhile, if the preliminary semiconductor layer 421 formed on the isolation layer 415 is not completely separated during the etching process to form the first trench 431, the adjacent semiconductor layer patterns 421a may be connected to each other at the top of the isolation layer 415, thereby generating an electric short circuit between adjacent cells. When a height of the preliminary semiconductor layer 421 is high, an aspect ratio of the first trench 431 is high, and thus an etch process may not be easy at the bottom portion of the first trench 431. However, because the facet 420a is formed at the preliminary semiconductor layer 421 as shown in FIG. 7C, the preliminary semiconductor layer 421 may be easily separated into the semiconductor layer patterns 421a on the isolation layer 415.

Figure 7D:
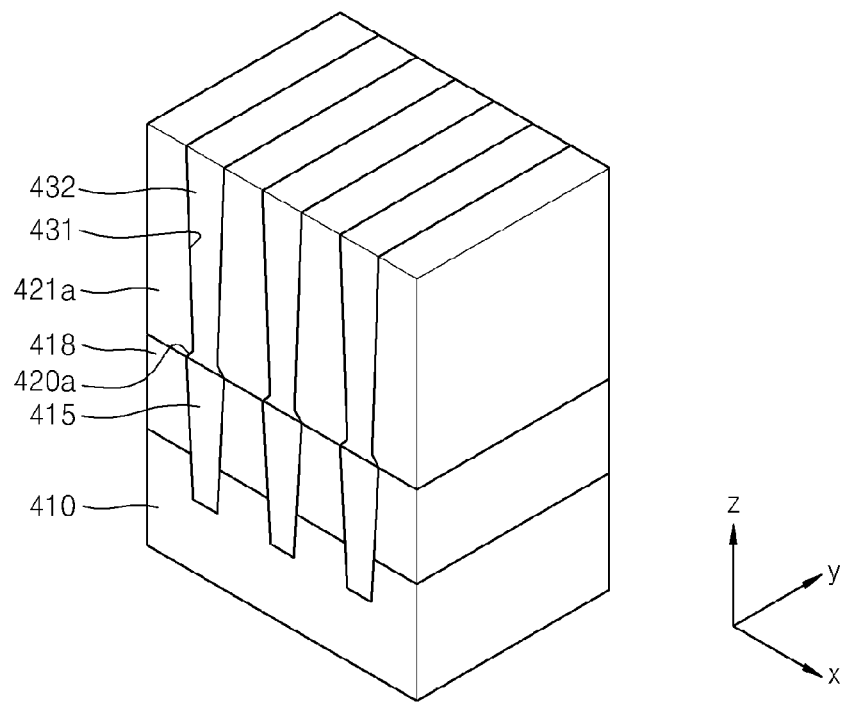

Referring to FIG. 7D, a first insulation layer 432 is formed on the isolation layer 415 and side walls of the semiconductor layer pattern 421a exposed by the first trench 431. According to example embodiments, the first insulation layer 432 filling the first trench 431 may be formed on the side walls of the semiconductor layer pattern 421a, and then the first insulation layer 432 may be planarized until the top surface of the semiconductor layer pattern 421a is exposed. The first insulation layer 432 may be extended in the y-direction.

Figure 7E:
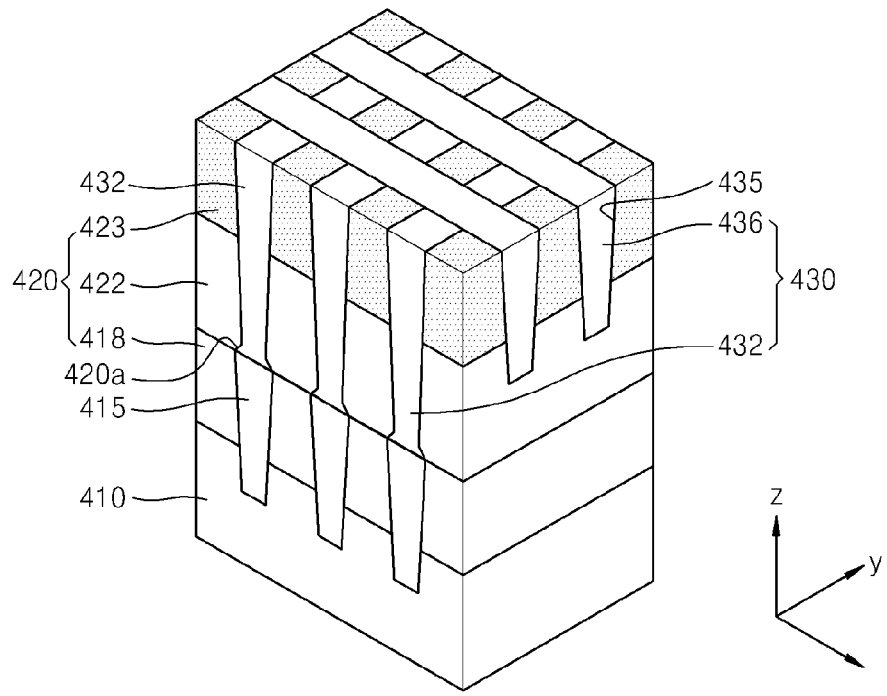

Referring to FIG. 7E, a plurality of second trenches 435 extending in a second direction (x-direction of FIG. 7E) having a given (or, alternatively predetermined) angle with the first direction are formed on the semiconductor layer patterns 421a of FIG. 7D and the first insulation layer 432. A second insulation layer 436 extending in the x-direction may be formed on the semiconductor pattern 421a and side walls and bottom surfaces of the first insulation layer 432, which are exposed by the second trench 435. The second insulation layer 436 may be formed to cross the first insulation layer 432. The second insulation layer 436 may be formed at a region where the first and second trenches 431 and 435 cross each other. The first and second insulation layers 432 and 436 may be defined as an insulation layer structure 430.

A third semiconductor layer 423 including third impurities is formed by performing an ion implantation process on the semiconductor layer pattern 421a. The third impurities may have a second conductivity type that is different from the first conductivity type. The third semiconductor layers 423 may be spaced apart from each other in the y- and x-directions by the first and second insulation layers 432 and 436.

A portion of the semiconductor layer pattern 421a below the third semiconductor layer 423 may be defined as a second semiconductor layer 422. The first semiconductor layer 418, the second semiconductor layer 422, and the third semiconductor layer 423 sequentially formed on the substrate 410 may form a conductive structure 420.

Figure 7F:
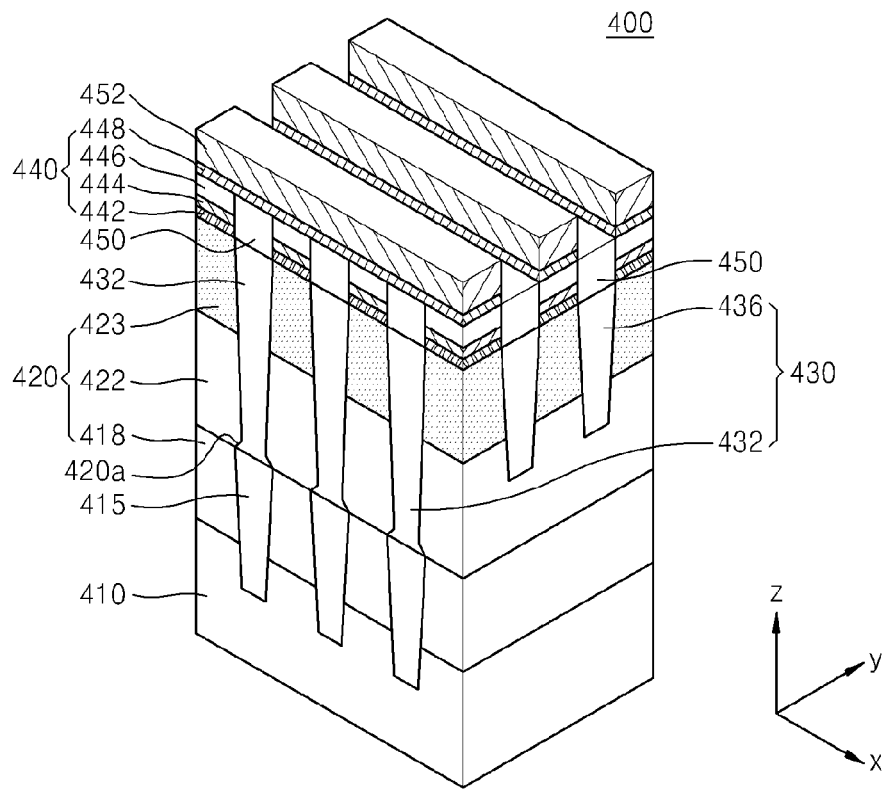

Referring to FIG. 7F, an ohmic layer (not shown), a lower electrode layer (not shown), and a phase change material layer (not shown) are sequentially formed on the third semiconductor layer 423 and the first and second insulation layers 432 and 436, and then the phase change material layer, the lower electrode layer, and the ohmic layer are patterned to form an ohmic layer pattern 442, a lower electrode 444, and a phase change material layer pattern 446 sequentially stacked on the third semiconductor layer 423. A third insulation layer 450 surrounding side walls of the ohmic layer pattern 442, lower electrode 444, and phase change material layer pattern 446 is formed on the first and second insulation layers 432 and 436. An upper electrode 448 and a bit line 452, which extend in the x-direction, are sequentially formed on the phase change material layer pattern 446 and the third insulation layer 450. Accordingly, a phase change memory unit 440 including the ohmic layer pattern 442, the lower electrode 444, the phase change material layer pattern 446, and the upper electrode 449 may be formed on the plurality of conductive structures 420.

The semiconductor device 400 is completed by performing the above processes.

FIGS. 8A through 8H are perspective views for describing a method of manufacturing a semiconductor device 500, according to example embodiments of the inventive concepts.

Figure 8A:
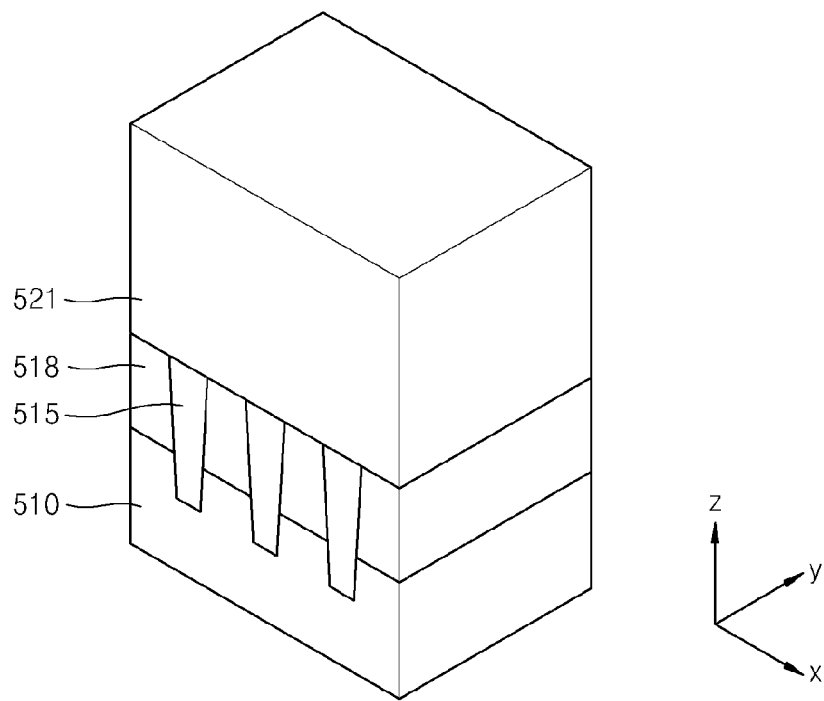
FIGS. 8A through 8H are perspective views for describing a method of manufacturing a semiconductor device, according to example embodiments of the inventive concepts.

Referring to FIG. 8A, a plurality of isolation layers 515 extending in a first direction (y-direction of FIG. 8A) and defining an active region are formed on a substrate 510. A first semiconductor layer 518 may be formed on the substrate 510 in the active region. According to example embodiments, the first semiconductor layer 518 may be formed by implanting first impurities having a first conductivity type into the active region.

A preliminary semiconductor layer 521 is grown from an exposed top surface of the first semiconductor layer 518 by performing an SEG process using a top surface of the first semiconductor layer 518 as a seed layer. As an epitaxial layer grows from a surface of the substrate 510 in 3D, the epitaxial layers grown from the adjacent active regions separated by the isolation layer 515 may be connected to each other at the top of the isolation layer 515. Accordingly, the preliminary semiconductor layer 521 may be formed on the substrate 510 and the isolation layer 515. A process of implanting second impurities having the first conductivity type into the preliminary semiconductor layer 521 may be further performed.

Figure 8B:
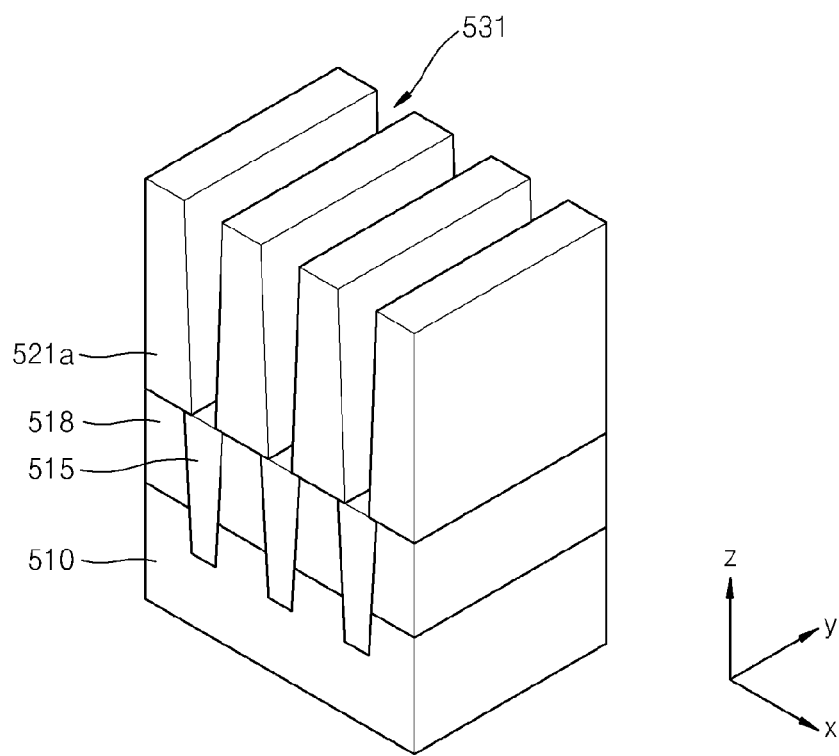

Referring to FIG. 8B, a plurality of first trenches 531 extending in the y-direction are formed on the preliminary semiconductor layer 521. The preliminary semiconductor layer 521 is separated into a plurality of semiconductor layer patterns 521a by the first trench 531, and a top surface of the isolation layer 515 may be exposed.

Figure 8C:
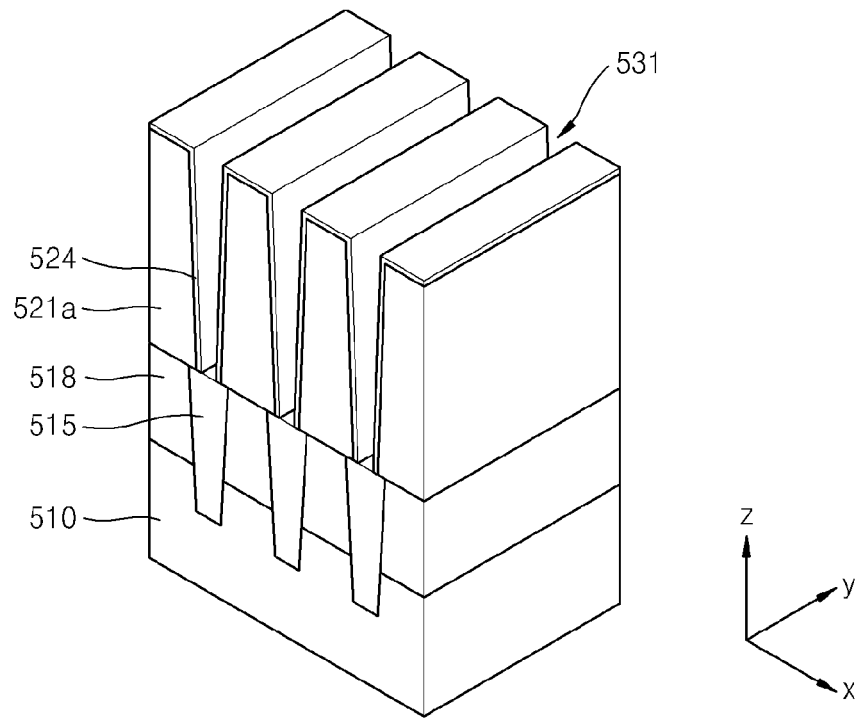

Referring to FIG. 8C, a thermal oxidation process is performed on the substrate 510 so as to form a first interface layer 524 on side walls and a top surface of the semiconductor layer pattern 521a exposed by the first trench 531. According to example embodiments, the thermal oxidation process may be performed at a temperature from about 800° C. to about 1000° C. The first interface layer 524 may include a silicon oxide formed by the thermal oxidation process. By performing the thermal oxidation process, a defect that may occur on the preliminary semiconductor layer 521 when the first trench 531 is formed may be cured, and thus crystallinity of the semiconductor layer pattern 521a may be improved. Meanwhile, a thermal nitridation process may be performed on the substrate 510 instead of the thermal oxidation process, and the first interface layer 524 may include a silicon nitride formed by the thermal nitridation process.

Figure 8D:
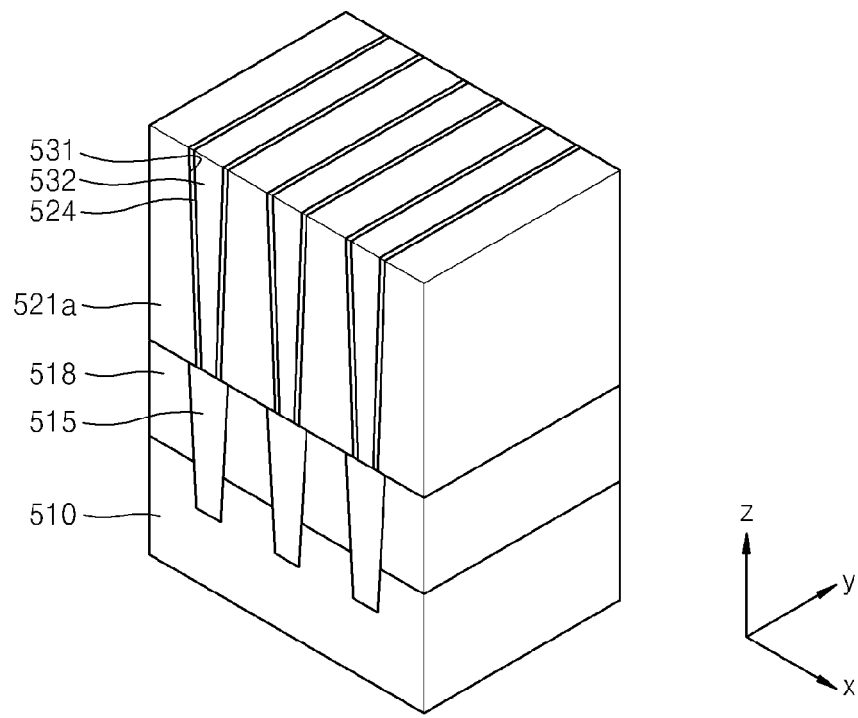

Referring to FIG. 8D, a first insulation layer 532 filling the first trench 531 is formed on the isolation layer 515 and side walls of the first interface layer 524. The first insulation layer 532 may be formed impurities a silicon oxide, a silicon oxynitride, a silicon nitride, or a combination thereof. According to example embodiments, after forming the first insulation layer 532 filling the first trench 531 on the isolation layer 515 and the side walls of the first interface layer 524, the top of the first insulation layer 532 may be planarized until an uppermost surface of the semiconductor layer pattern 521a is exposed. Here, the first interface layer 524 formed on the uppermost surface of the semiconductor layer pattern 521a may be removed.

Figure 8E:
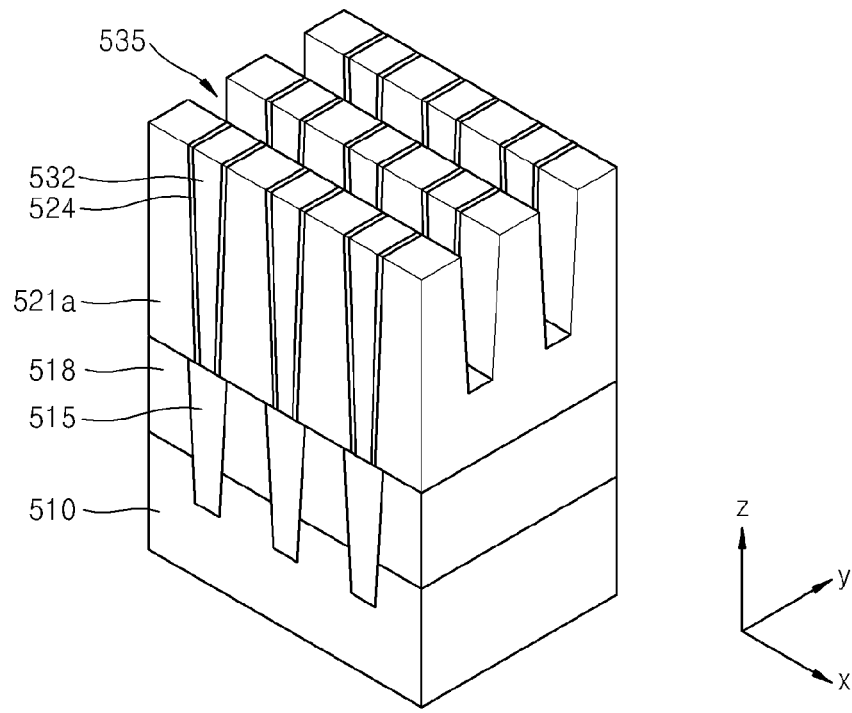

Referring to FIG. 8E, a plurality of trenches 535 extending in a second direction (x-direction of FIG. 8E) having a given (or, alternatively predetermined) angle with the first direction are formed on the first interface layer 524, the semiconductor layer pattern 521a, and the first insulation layer 532.

Figure 8F:
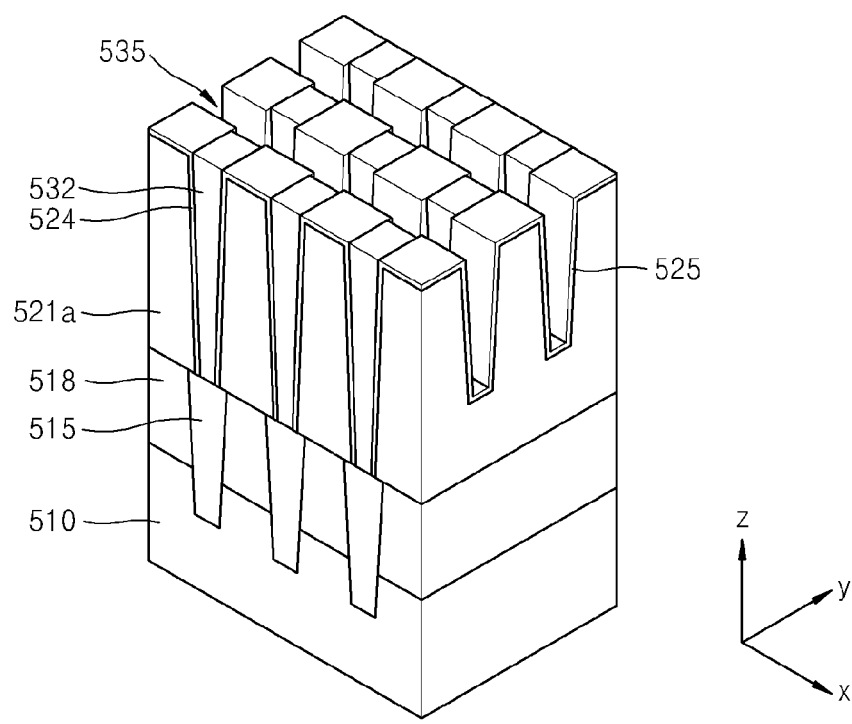

Referring to FIG. 8F, a second interface layer 525 is formed on side walls and a top surface of the semiconductor layer pattern 521a exposed by performing the thermal oxidation process on the substrate 510. The thermal oxidation process may be performed at a temperature from about 800° C. to about 1000° C. The second interface layer 525 may include a silicon oxide formed by the thermal oxidation process. By performing the thermal oxidation process, a defect that may occur on the semiconductor layer pattern 521 when the second trench 535 is formed may be cured, and crystallinity of the semiconductor layer pattern 521a may be improved. Meanwhile, a thermal nitridation process may be performed on the substrate 510 instead of the thermal oxidation process, and at this time, the second interface layer 525 may include a silicon nitride formed by the thermal nitridation process.

Figure 8G:
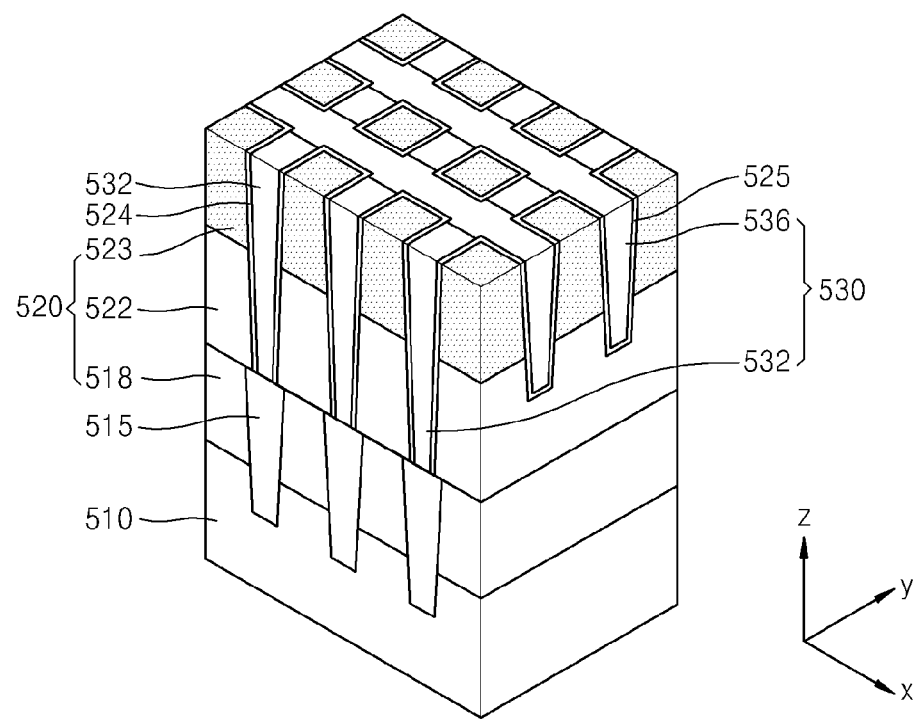

Referring to FIG. 8G, a second insulation layer 536 filling the second trench 525 is formed on the second interface layer 525 and the first insulation layer 532. The second insulation layer 536 may be formed using a silicon oxide, a silicon oxynitride, a silicon nitride, or a combination thereof. According to example embodiments, after forming the second insulation layer 536 filling the second trench 535 on the second interface layer 525 and the first insulation layer 532, the top of the second insulation layer 536 may be planarized until the uppermost surface of the semiconductor layer pattern 521a is exposed. Here, the second interface layer 525 formed on the uppermost surface of the semiconductor layer pattern 521a may also be removed. The second insulation layer 536 may be formed to cross the first insulation layer 532. The second insulation layer 536 may be formed at a region where the first trench 531 of FIG. 8C and the second trench 535 of FIG. 8F cross each other. The first and second insulation layers 532 and 536 may be defined as an insulation layer structure 530.

An ion implantation process is performed on the semiconductor layer pattern 521a to form a third semiconductor layer 523 including third impurities. The third impurities may have a second conductivity type that is different from the first conductivity type. The third semiconductor layers 523 may be spaced apart from each other in the y- and x-directions by the first and second interface layers 524 and 525 and the first and second insulation layers 532 and 536.

A portion of the semiconductor layer pattern 521a below the third semiconductor layer 523 may be defined as a second semiconductor layer 522. The first semiconductor layer 518, the second semiconductor layer 522, and the third semiconductor layer 523 sequentially formed on the substrate 510 may form a conductive structure 520.

Figure 8H:
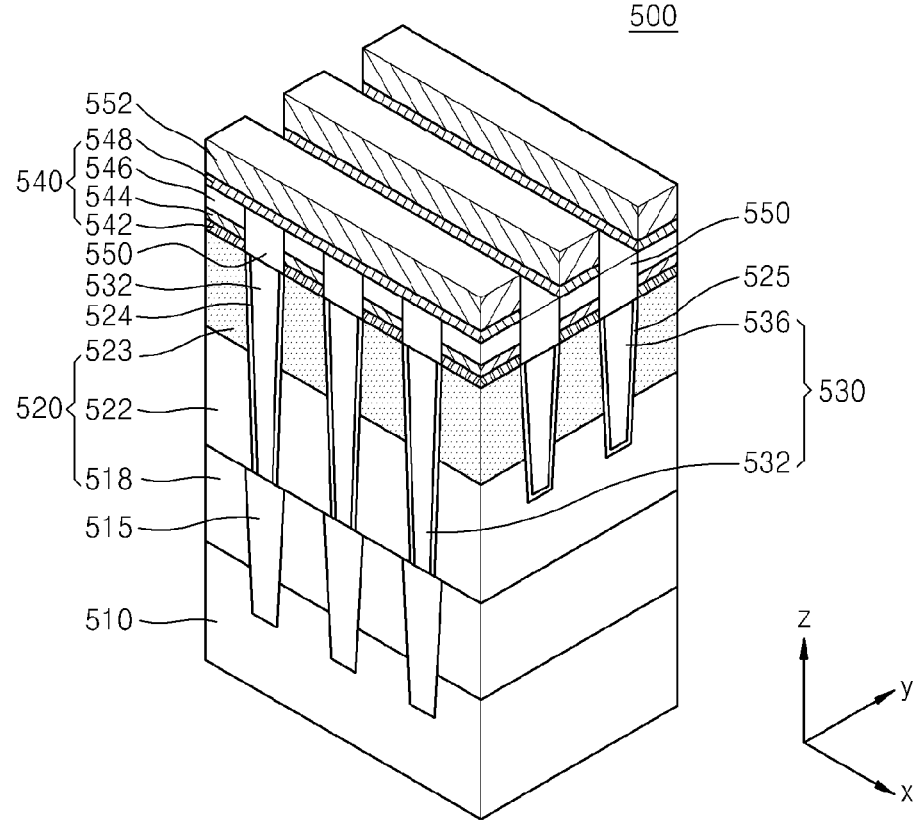

Referring to FIG. 8H, an ohmic layer (not shown), a lower electrode layer (not shown), and a phase change material layer (not shown) are sequentially formed on the third semiconductor layer 523 and the first and second insulation layers 532 and 536, and then the phase change material layer, the lower electrode layer, and the ohmic layer are patterned to form an ohmic layer pattern 542, a lower electrode 544, and a phase change material layer pattern 546 sequentially stacked on the third semiconductor layer 523. A third insulation layer 550 surrounding side walls of the ohmic layer pattern 542, lower electrode 544, and phase change material layer pattern 546 is formed on the first and second insulation layers 532 and 536. An upper electrode 548 and a bit line 552, which extend in the x-direction, are sequentially formed on the phase change material layer pattern 546 and the third insulation layer 550. Accordingly, a phase change memory unit 540 including the ohmic layer pattern 542, the lower electrode 544, the phase change material layer pattern 546, and the upper electrode 548 may be formed on the plurality of conductive structures 520.

The semiconductor device 500 is completed by performing the above processes.

FIGS. 9A through 9F are perspective views for describing a method of manufacturing a semiconductor device 600, according to example embodiments of the inventive concepts.

Figure 9A:
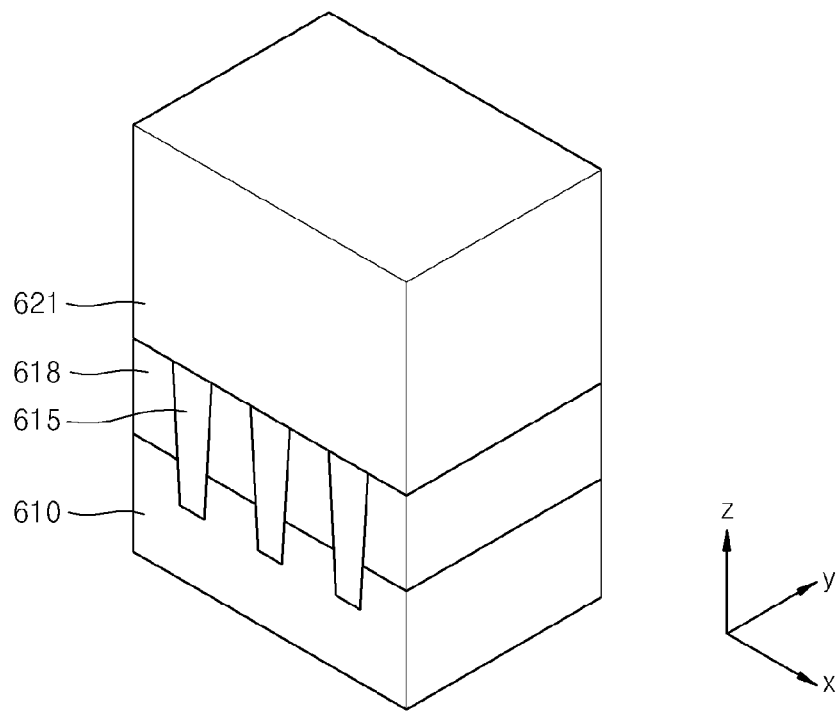
FIGS. 9A through 9F are perspective views for describing a method of manufacturing a semiconductor device, according to example embodiments of the inventive concepts.

Referring to FIG. 9A, a plurality of isolation layers 615 extending in a first direction (y-direction in FIG. 9A) and defining an active region are formed on a substrate 610. A first semiconductor layer 618 may be formed on the substrate 610 in the active region. According to example embodiments, the first semiconductor layer 618 may be formed by implanting first impurities having a first conductivity type into the active region.

A preliminary semiconductor layer 621 is grown from an exposed top surface of the first semiconductor layer 618 by performing an SEG process using a top surface of the first semiconductor layer 618 as a seed layer. As an epitaxial layer grows from a surface of the substrate 610 in 3D, the epitaxial layers grown from the adjacent active regions separated by the isolation layer 615 may be connected to each other at the top of the isolation layer 615. Accordingly, the preliminary semiconductor layer 621 may be formed on the substrate 610 and the isolation layer 615.

A process of implanting second impurities having the first conductivity type into the preliminary semiconductor layer 621 may be further performed.

Figure 9B:
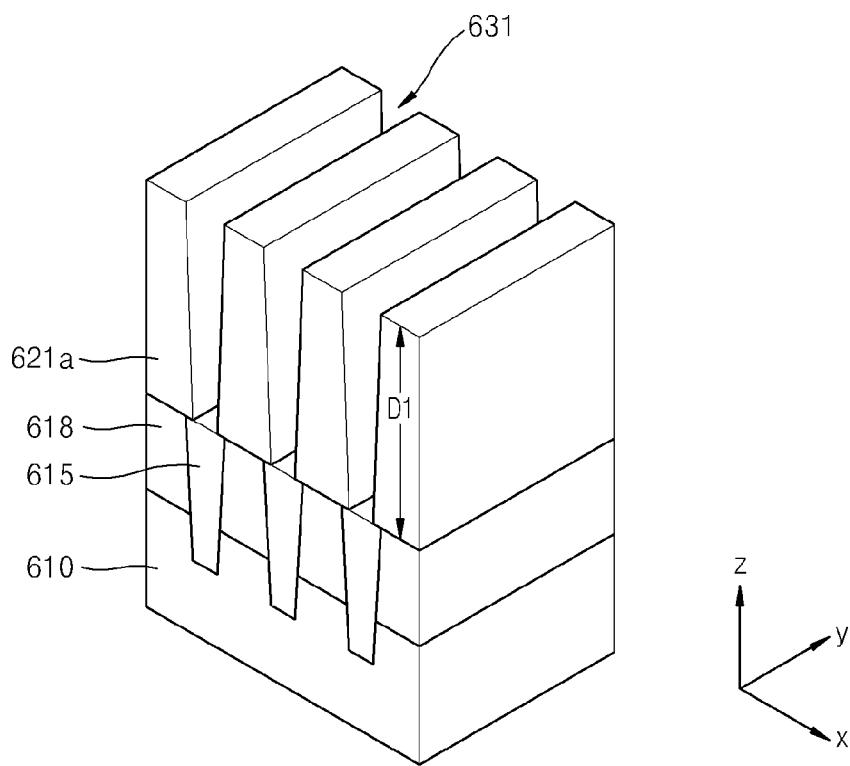

Referring to FIG. 9B, a plurality of first trenches 631 extending in the y-direction are formed on the preliminary semiconductor layer 621. The first trench 631 has a first depth D1, and the first depth D1 may be higher than a height of the preliminary semiconductor layer 521 (refer to FIG. 9A). Accordingly, the preliminary semiconductor layer 621 may be separated into a plurality of semiconductor layer patterns 621a by the first trenches 631, and the top surface of the isolation layer 615 may be exposed.

Figure 9C:
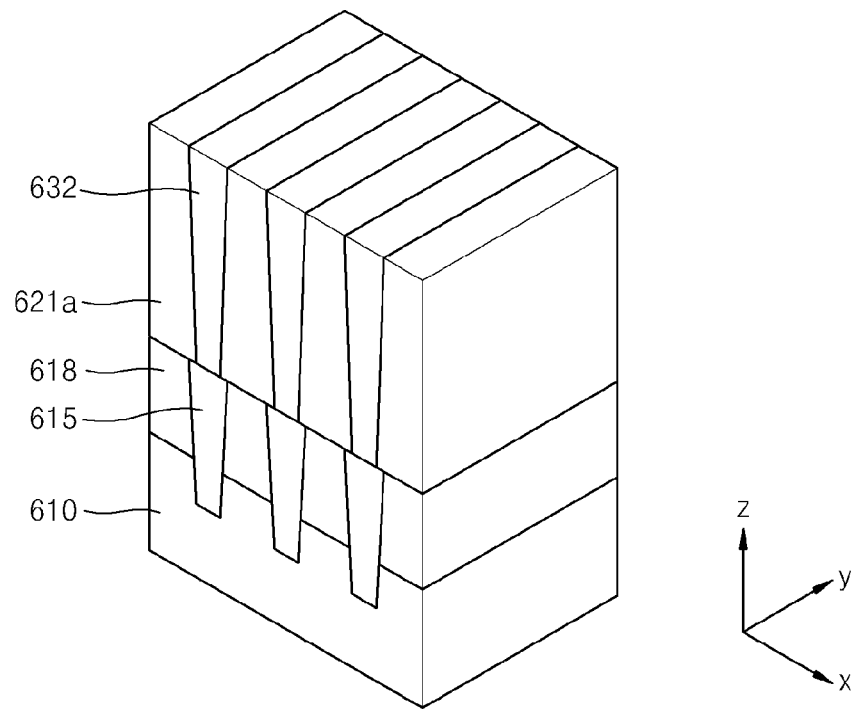

Referring to FIG. 9C, a first insulation layer 632 filling the first trench 631 is formed on the isolation layer 615 and side walls of the first interface layer 524. The first insulation layer 632 may be formed using a silicon oxide, a silicon oxynitride, a silicon nitride, or a combination thereof.

Figure 9D:
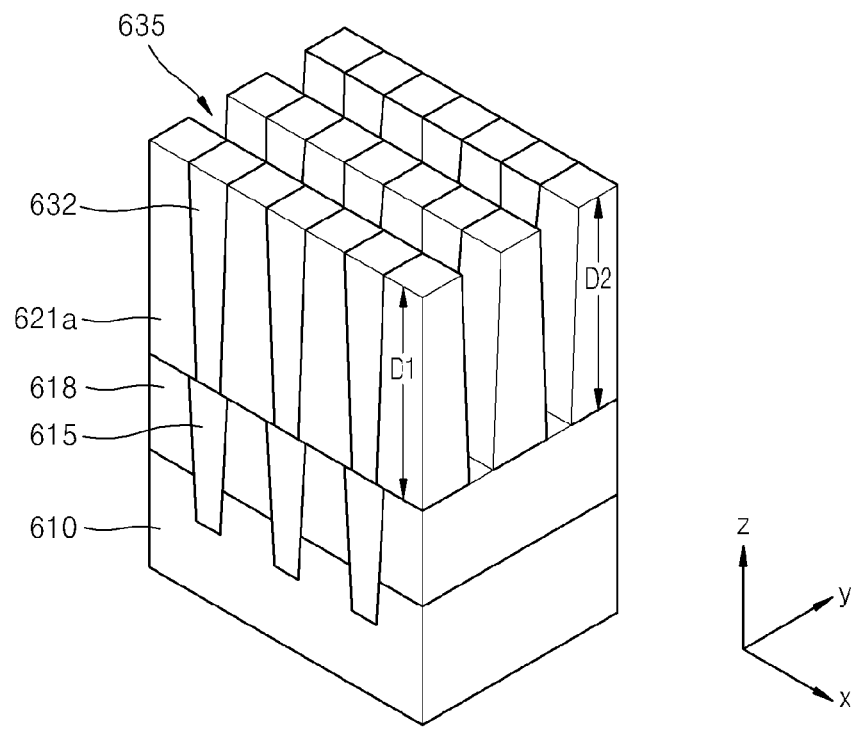

Referring to FIG. 9D, a plurality of second trenches 635 extending in a second direction (x-direction of FIG. 9E) having a given (or, alternatively predetermined) angle with the first direction are formed on the semiconductor layer pattern 621a and the first insulation layer 632. The second trench 635 has a second depth D2, and the second depth D2 may be substantially the same or higher than the height of the preliminary semiconductor layer 521 (refer to FIG. 9A). Accordingly, the top surfaces of the isolation layer 615 and first semiconductor layer 618 may be exposed by the second trenches 635. Also, the first insulation layer 632 may be separated by the second trench 635, thereby forming a plurality of island shapes spaced apart from each other in the x- and y-directions. The semiconductor layer patterns 621a may be separated by the second trenches 635, thereby forming a plurality of island shapes spaced apart from each other in the x- and y-directions.

Figure 9E:
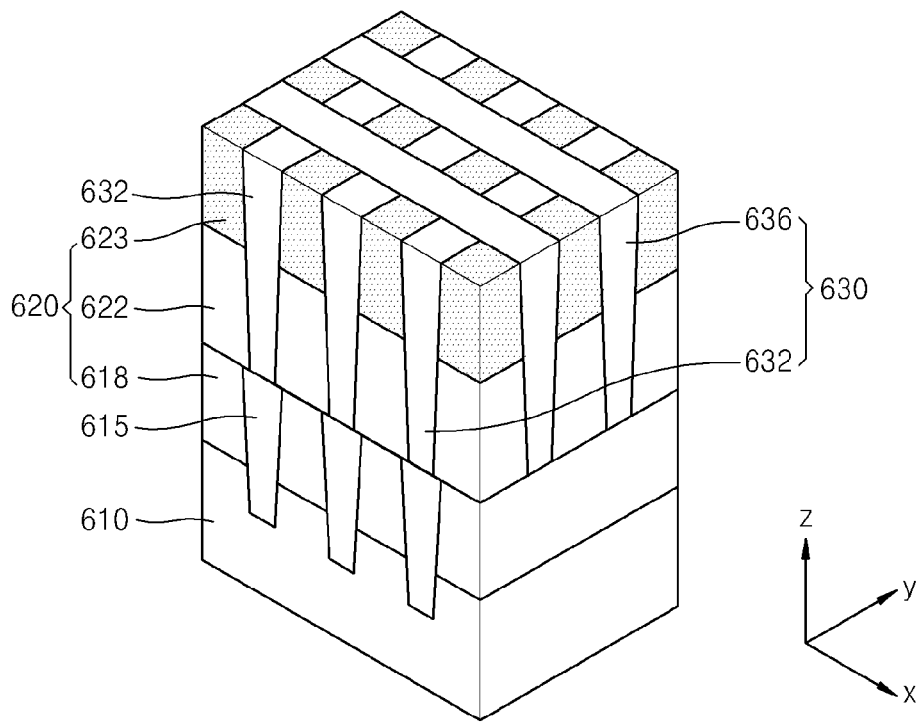

Referring to FIG. 9E, a second insulation layer 636 filling the second trench 635 is formed on the side walls of the semiconductor layer pattern 621a of FIG. 9A and first insulation layer 632, and on the isolation layer 615 and first semiconductor layer 618. The second insulation layer 636 may be formed using a silicon oxide, a silicon oxynitride, a silicon nitride, or a combination thereof. The second insulation layer 636 may be formed to cross the first insulation layer 632, and the second insulation layer 636 may be formed at a region where the first and second trenches 631 and 635 cross each other. The first and second insulation layers 632 and 636 may be defined as an insulation layer structure 630.

A third insulation layer 623 including third impurities is formed by performing an ion implantation process on the semiconductor layer pattern 621a. The third impurities may have a second conductivity type that is different from the first conductivity type. The third semiconductor layers 623 may be spaced apart from each other in the y- and x-directions by the first and second insulation layers 632 and 636.

A portion of the semiconductor layer pattern 621a below the third semiconductor layer 623 may be defined as a second semiconductor layer 622. The first semiconductor layer 618, the second semiconductor layer 622, and the third semiconductor layer 623 sequentially formed on the substrate 610 may form a conductive structure 620. The top of the conductive structure 620, e.g., regions where the second semiconductor layer 622 and the third semiconductor layer 623 are formed, may be spaced apart in the x- and y-directions, and the bottom of the conductive structure 620, e.g., a region where the first semiconductor layer 618 is formed, may extend in the y-direction.

Figure 9F:
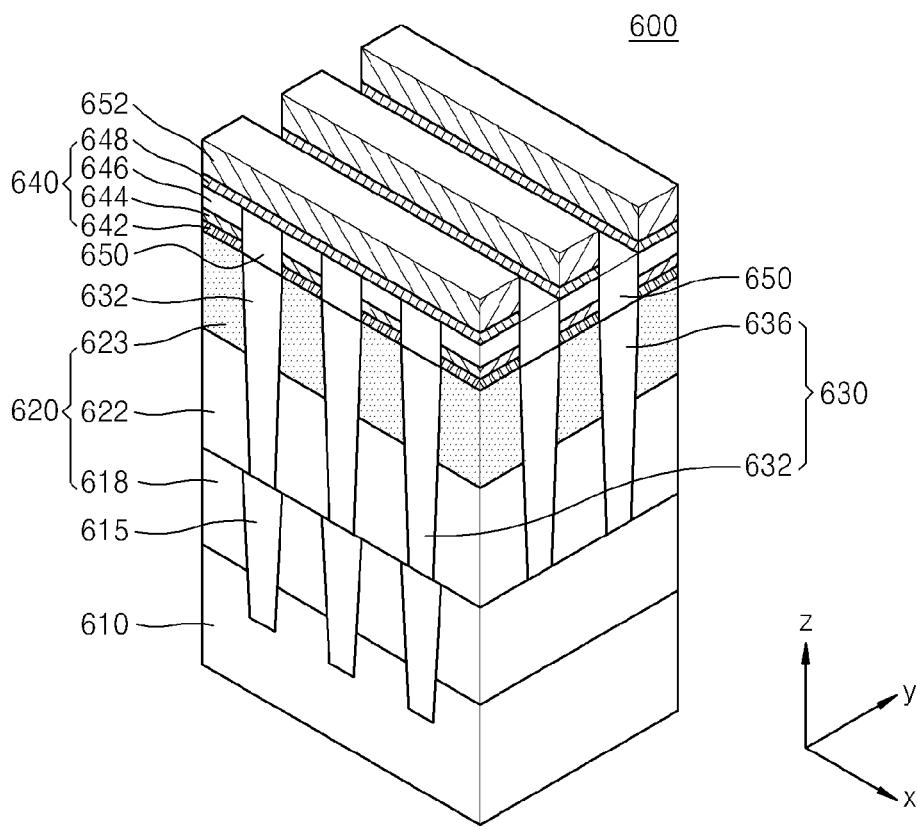

Referring to FIG. 9F, an ohmic layer (not shown), a lower electrode layer (not shown), and a phase change material layer (not shown) are sequentially formed on the third semiconductor layer 623 and the first and second insulation layers 632 and 636, and then the phase change material layer, the lower electrode layer, and the ohmic layer are patterned to form an ohmic layer pattern 642, a lower electrode 644, and a phase change material layer pattern 646 sequentially on the third semiconductor layer 623. A third insulation layer 650 surrounding side walls of the ohmic layer pattern 642, the lower electrode 644, and the phase change material layer pattern 646 is formed on the first and second insulation layers 632 and 636. An upper electrode 648 and a bit line 652, which extend in the x-direction, are sequentially formed on the phase change material layer pattern 646 and the third insulation layer 650. Accordingly, a phase change memory unit 640 including the ohmic layer pattern 642, the lower electrode 644, the phase change material layer pattern 646, and the upper electrode 648 may be formed on the plurality of conductive structures 620.

The semiconductor device 600 is completed by performing the above processes.

FIGS. 10A through 10G are perspective views for describing a method of manufacturing a semiconductor device 700, according to example embodiments of the inventive concepts.

Figure 10A:
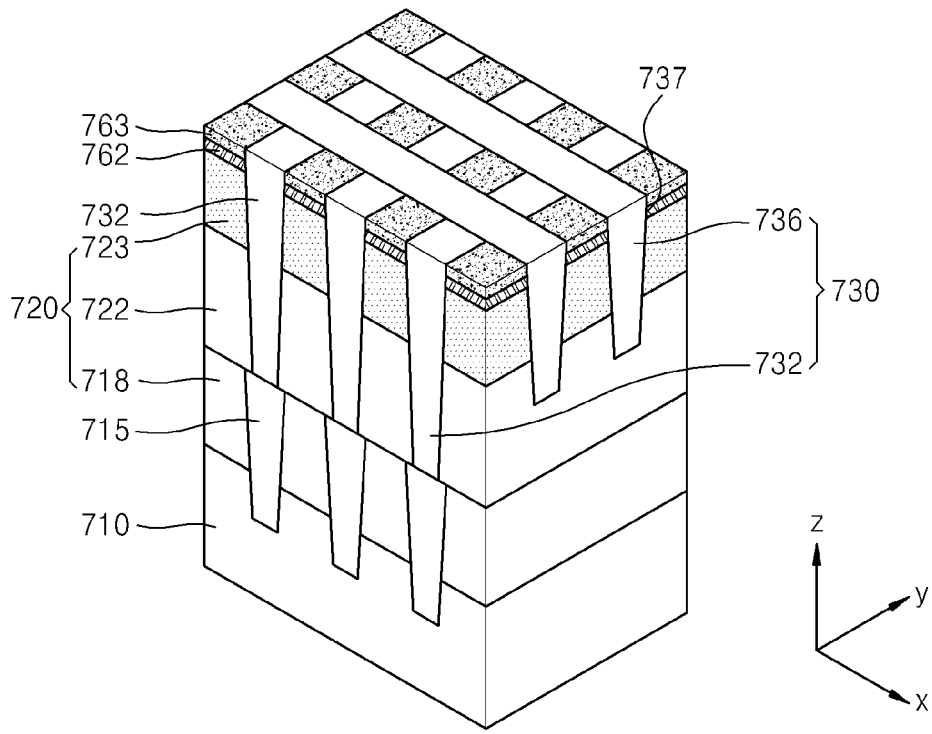
FIGS. 10A through 10G are perspective views for describing a method of manufacturing a semiconductor device, according to example embodiments of the inventive concepts.

Referring to FIG. 10A, a conductive structure 720 including first through third semiconductor layers 718, 722, and 723, and first and second insulation layers 732 and 736 are formed on a substrate 710 by performing the processes described above with reference to FIGS. 4A through 4F.

A first recess 737 is formed by etching a part of a top portion of the third semiconductor layer 723.

A silicidation process may be performed on a top surface of the third semiconductor layer 723 exposed by the first recess 737 so as to form an ohmic layer pattern 762 on the third semiconductor layer 723. The ohmic layer pattern 762 may include a metal silicide, e.g., a tungsten silicide, a nickel silicide, or a cobalt silicide. The ohmic layer pattern 762 has a uniform thickness, and may fill a part of the first recess 737.

A barrier layer 763 filling a remaining part of the first recess 737 is formed on the ohmic layer pattern 762. The barrier layer 763 may be formed using tungsten or tungsten nitride. The barrier layer 763 may prevent or inhibit a reaction between the ohmic layer pattern 762 and a lower electrode 764a of FIG. 10F which will be formed in a subsequent process.

Figure 10B:
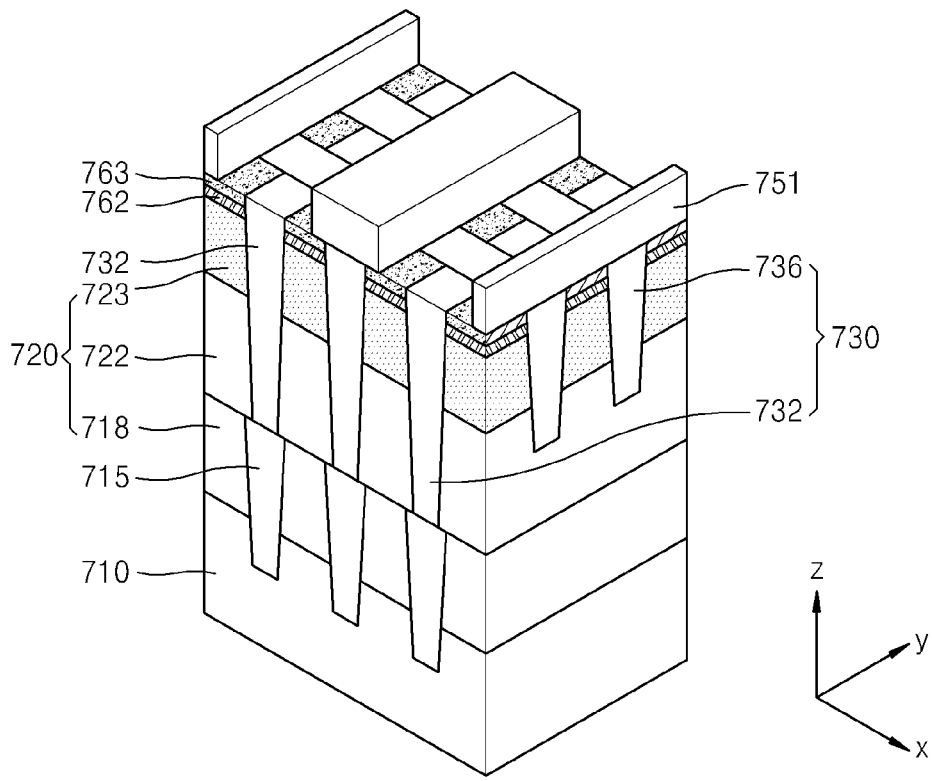

Referring to FIG. 10B, a third insulation layer 751 extending in a y-direction may be formed on the ohmic layer pattern 762 and the first and second insulation layers 732 and 736. The third insulation layer 751 may be arranged to expose a part of a top surface of the barrier layer 763. In FIG. 10B, the third insulation layer 751 simultaneously exposes the two adjacent barrier layers 763 in the x-direction having island shapes. However, alternatively, the third insulation layers 751 may be formed to expose the barrier layers 763, respectively. According to example embodiments, the third insulation layer 751 may be formed by forming an insulation layer (not shown) covering the barrier layer 763 and first and second insulation layers 732 and 736, and then patterning the insulation layer to expose a part of the barrier layer 763. The third insulation layer 751 may operate as a mold layer for forming a lower electrode.

Figure 10C:
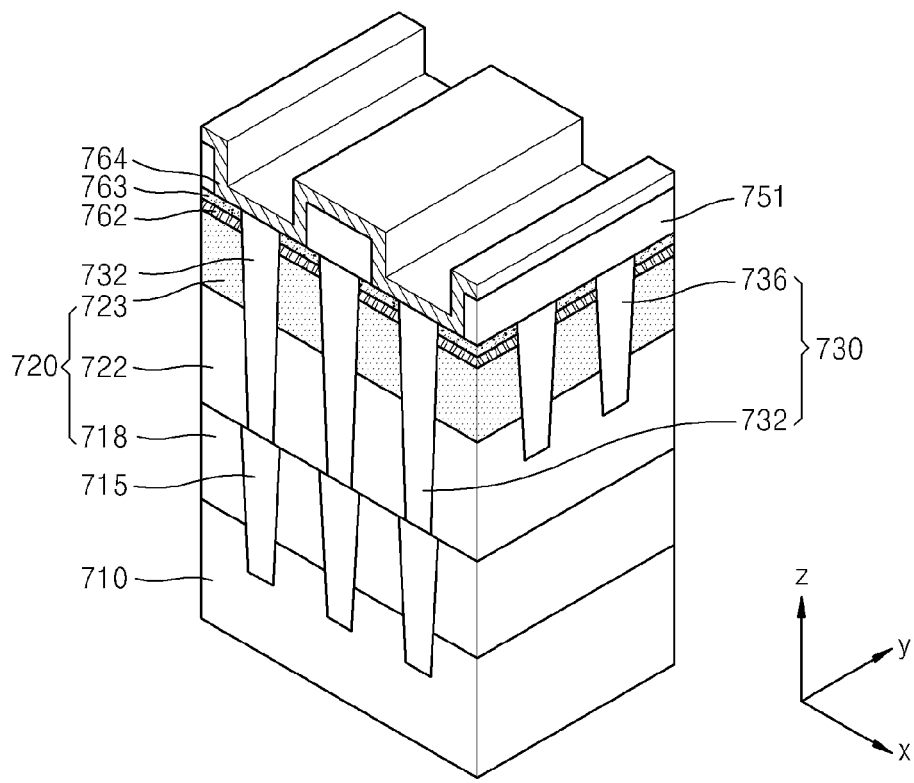

Referring to FIG. 10C, a lower electrode layer 764 is conformally formed on the barrier layer 763 and first, second, and third insulation layers 732, 736, and 751. A thickness of the lower electrode layer 764 on a side wall of the third insulation layer 751 may be similar to a thickness of the lower electrode layer 764 on the barrier layer 763.

Figure 10D:
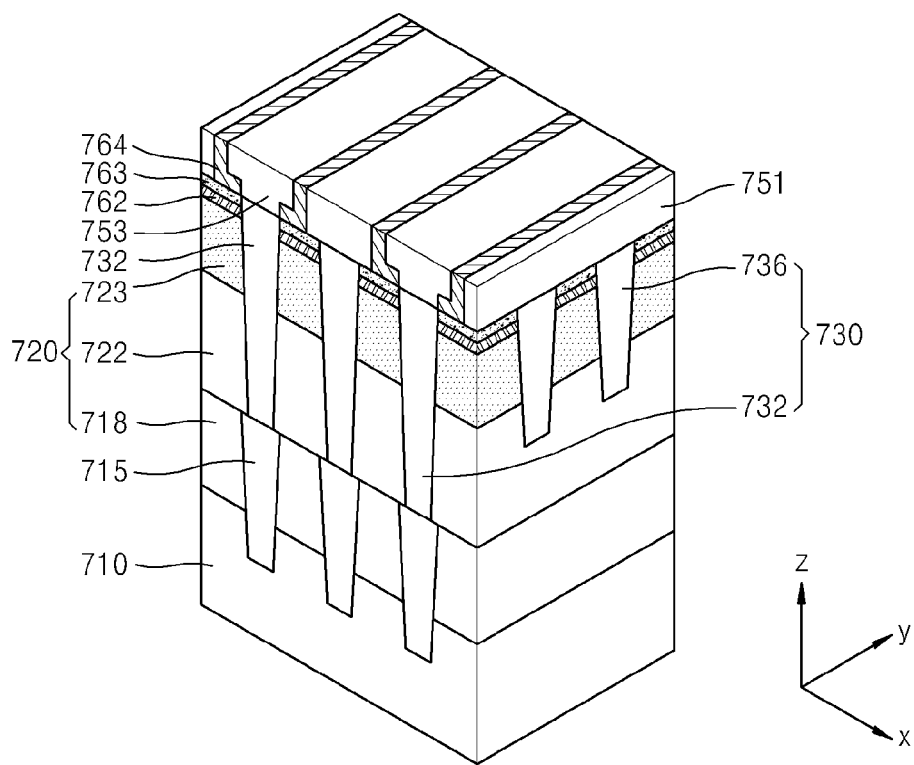

Referring to FIG. 10D, the lower electrode layer 764 is patterned and separated to have a plurality of line shapes along the y-direction. According to example embodiments, a part of the lower electrode layer 764 formed on the first insulation layer 732 is removed, and a remaining part of the lower electrode layer 764 is extended in a plurality of line shapes conformally formed on a top surface and side walls of the third insulation layer 751. A fourth insulation layer 753 is formed on the remaining lower electrode layer 764 and the exposed first and second insulation layers 732 and 736. A top surface of the fourth insulation layer 753 may be planarized until a top surface of the third insulation layer 751 is exposed. In FIG. 10D, the lower electrode layer 764 is formed on the barrier layer 763 and the side walls of the third insulation layer 751, and has an "L" shaped cross section in the y-direction. However, alternatively, the lower electrode layer 764 may be formed on the barrier layer 763 and the side walls of the third insulation layer 751, and have a rectangular cross section in the y-direction.

Figure 10E:
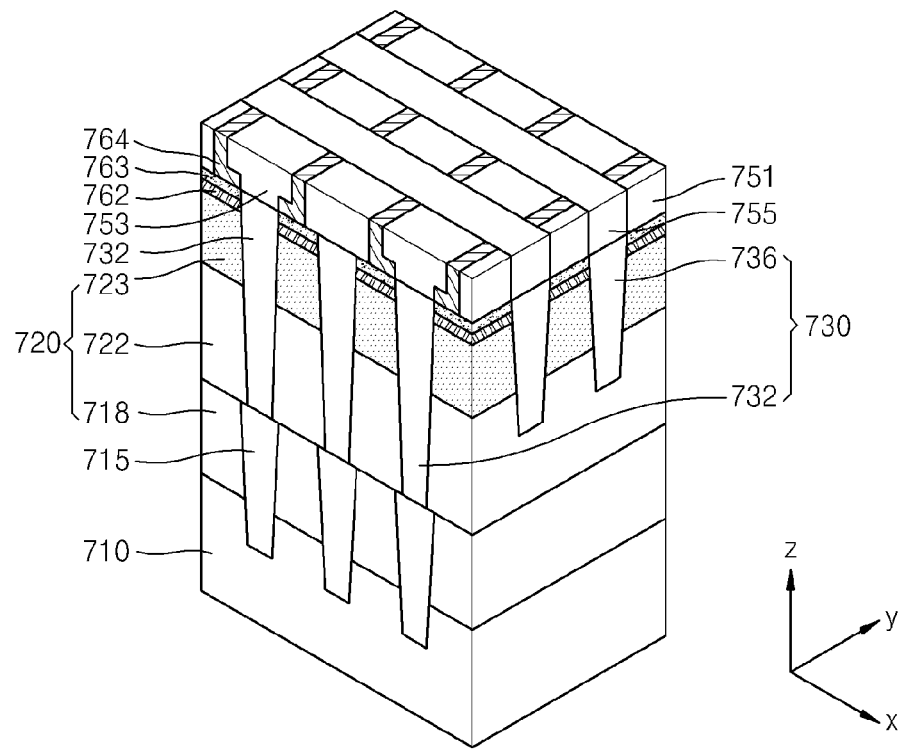

Referring to FIG. 10E, the lower electrode layer 764 is patterned in the x-direction to remove a portion of the lower electrode layer 764 on the second insulation layer 736, and a fifth insulation layer 755 is formed on the exposed second insulation layer 736. Accordingly, the lower electrode layer 764 may have a plurality of island shapes spaced apart from each other in the x- and y-directions on the barrier layer 763.

Figure 10F:
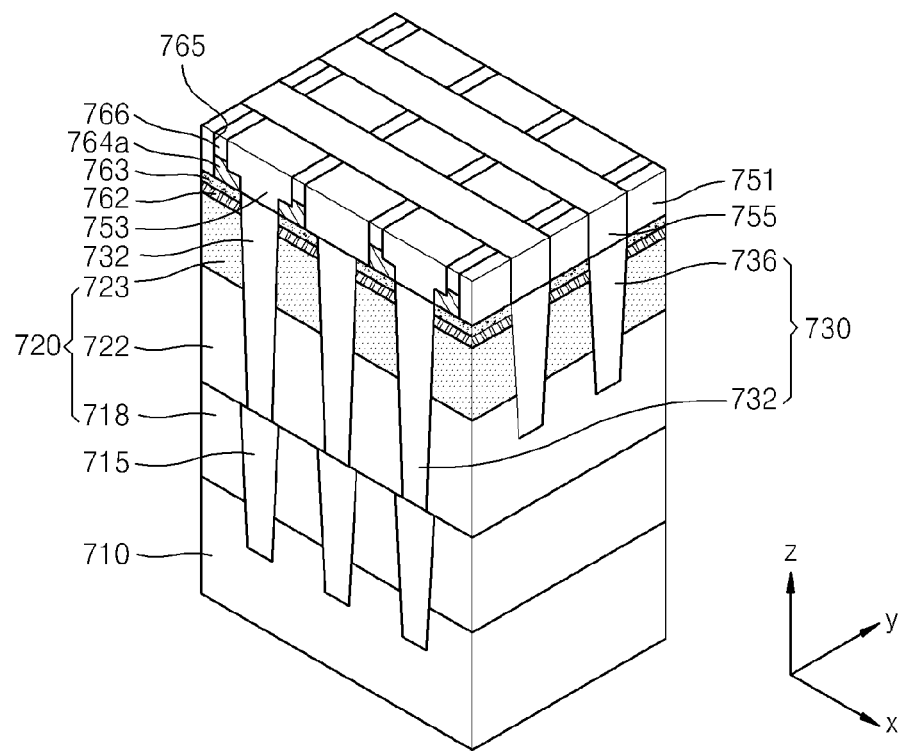

Referring to FIG. 10F, the lower electrode 764a is formed by removing a top portion of the lower electrode layer 764 (refer to FIG. 10E), and a second recess 765 is formed on the lower electrode 764a. A phase change material layer pattern 766 filling the second recess 765 is formed on the lower electrode 764a.

Figure 10G:
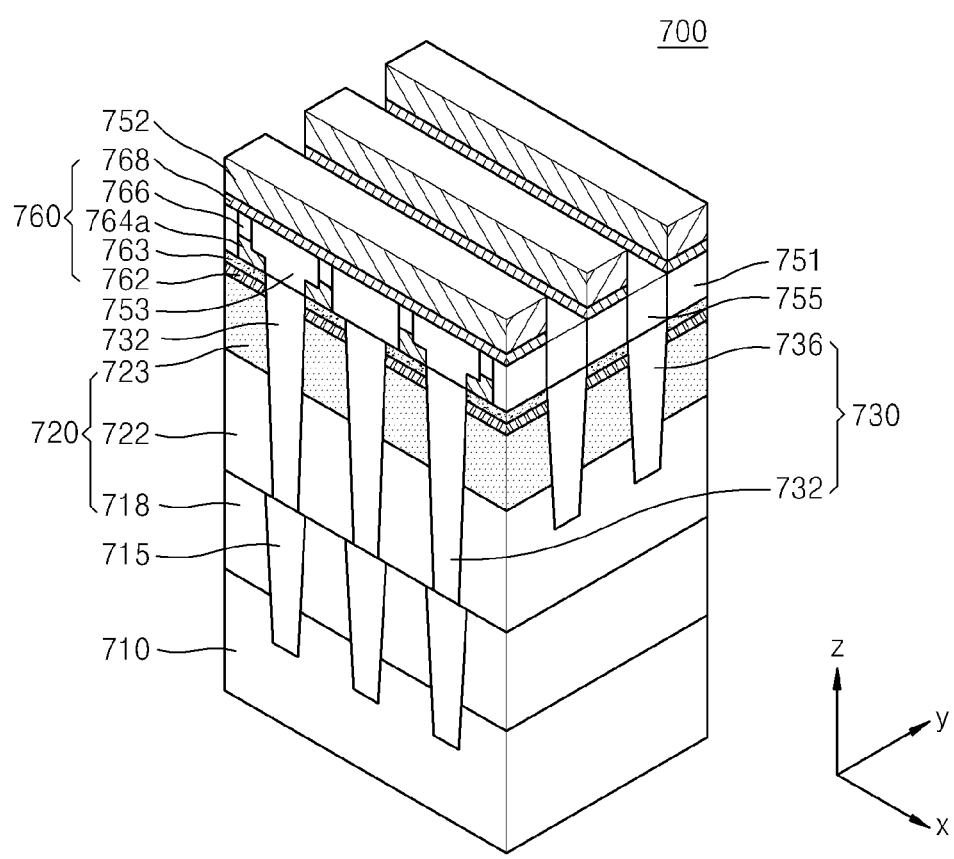

Referring to FIG. 10G, an upper electrode 768 extending in the x-direction is formed on the phase change material layer pattern 766, the third insulation layer 751, and the fifth insulation layer 755. In FIG. 10G, the upper electrode 768 extends in the x-direction while being connected to each of the phase change material layer patterns 766 spaced apart in the x-direction, but alternatively, the upper electrodes 768 may be formed on the phase change material layer pattern 766 in the second recesses 765, and spaced apart in the x-direction. A bit line 772 extending in the x-direction is formed on the upper electrode 768. The semiconductor device 700 is formed by performing the above processes.

Figure 11A:
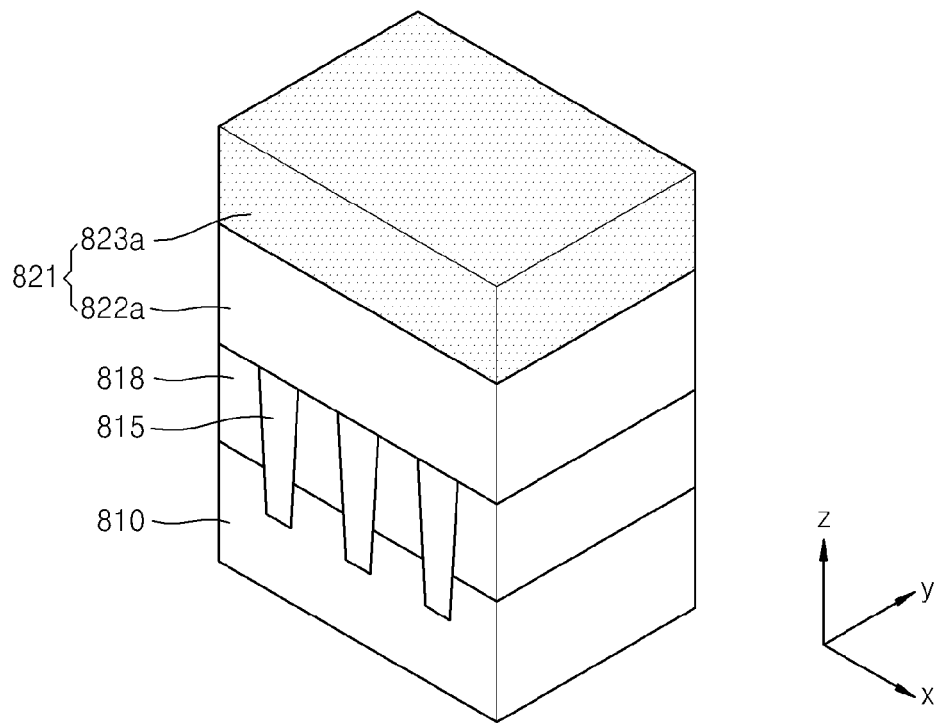
FIGS. 11A through 11C are perspective views for describing a method of manufacturing a semiconductor device, according to example embodiments of the inventive concepts.
Figure 11B:
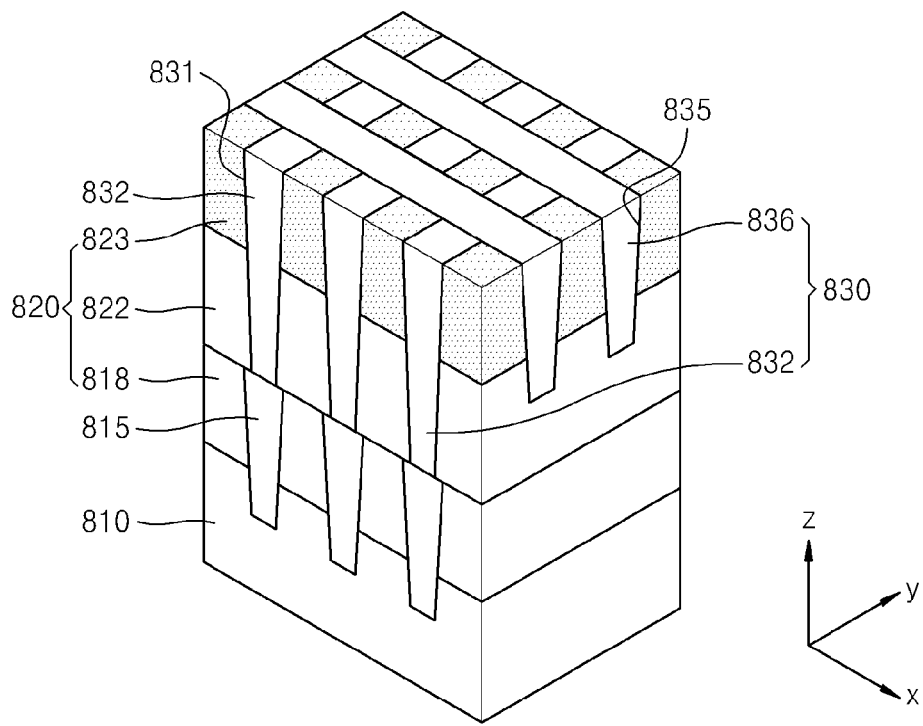
Figure 11C:
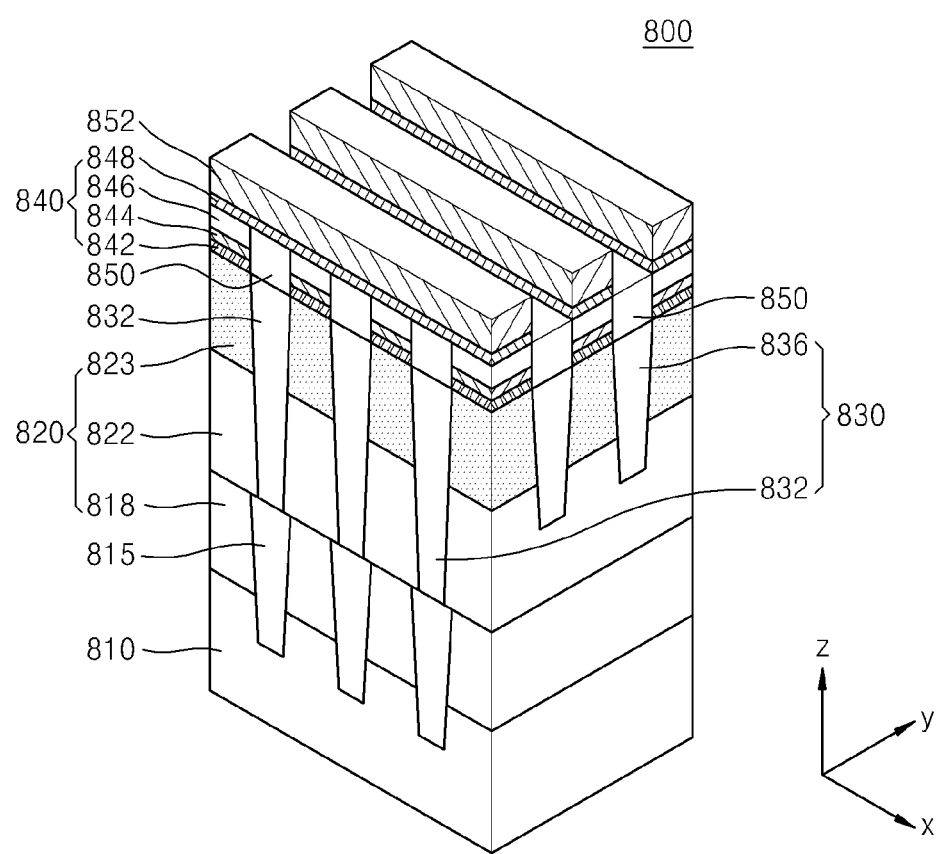

FIGS. 11A through 11C are perspective views for describing a method of manufacturing a semiconductor device 800, according to example embodiments of the inventive concepts.

Referring to FIG. 11A, a first preliminary semiconductor layer 822a is formed on a substrate 810 on which a plurality of isolation layers 815 and a first semiconductor layer 818 are formed. According to example embodiments, the first preliminary semiconductor layer 822a is grown from an exposed top surface of the first semiconductor layer 818 by performing an SEG process using a top surface of the first semiconductor layer 818 as a seed layer. For example, the first preliminary semiconductor layer 822a may be a single crystal semiconductor layer not doped with impurities. Alternatively, the first preliminary semiconductor layer 822 may be a single crystal semiconductor layer doped with a small amount of second impurities having the same conductivity type as first impurities included in the first semiconductor layer 818.

A second preliminary semiconductor layer 823a is formed on the first preliminary semiconductor layer 822a. According to example embodiments, the second preliminary semiconductor layer 823a may be formed by performing an SEG process using a top surface of the first preliminary semiconductor layer 822a as a seed layer. Meanwhile, an impurity ion may be doped in situ while performing the SEG process. For example, the second preliminary semiconductor layer 823a may be formed by in situ doping third impurities having a conductivity type that is different from the first impurities. Accordingly, the second preliminary semiconductor layer 823a may be third impurities doped single crystal semiconductor layer. The third impurities may be p-type impurities, e.g., B, Ga, or In.

Accordingly, the first and second preliminary semiconductor layers 822a and 823a may be referred to as a preliminary semiconductor layer 821. When the first and second preliminary semiconductor layers 822a and 823a are each formed by the SEG process, a process of implanting impurities may not be performed.

Referring to FIG. 11B, a conductive structure 820 and an insulation layer structure 830 are formed by performing the processes described above with reference to FIGS. 4C through 4F. The conductive structure 820 may include the first semiconductor layer 818, a second semiconductor layer 822, and a third semiconductor layer 823, and the insulation layer structure 830 may include first and second insulation layers 832 and 836.

According to example embodiments, the preliminary semiconductor layer 821 is separated so as to extend in a first direction (y-direction of FIG. 11B) by patterning the preliminary semiconductor layer 821, and a top surface of the isolation layer 815 is exposed. Accordingly, the first and second preliminary semiconductor layers 822a and 823a are both extended in the y-direction.

The first insulation layer 832 is formed on the exposed top surface of the isolation layer 815 and side walls of the preliminary semiconductor layer 821.

The second and third semiconductor layers 822 and 823 are formed by patterning the first and second preliminary semiconductor layers 822a and 823a and the first insulation layer 832 by a given (or, alternatively predetermined) depth in a second direction (x-direction of FIG. 11B) perpendicular to the first direction. Here, the second preliminary semiconductor layer 823a may be etched deeper than its depth, thereby being separated in the y-direction. Accordingly, the plurality of third semiconductor layers 823 separated in the x- and y-directions are formed. Also, a part of the top surface of the second semiconductor layer 822 may be etched, and the second semiconductor layer 822 may still extend in the y-direction.

The second insulation layer 836 is formed on the side walls of the second and third semiconductor layers 822 and 823 exposed by the patterning process, and the side walls of the first insulation layer 832.

Referring to FIG. 11C, a phase change memory unit 840 including an ohmic layer pattern 842, a lower electrode 844, a phase change material layer pattern 846, and an upper electrode 848 may be formed by performing the processes described above with reference to FIG. 4G.

The semiconductor device 800 is completed by performing the above processes.

Figure 12A:
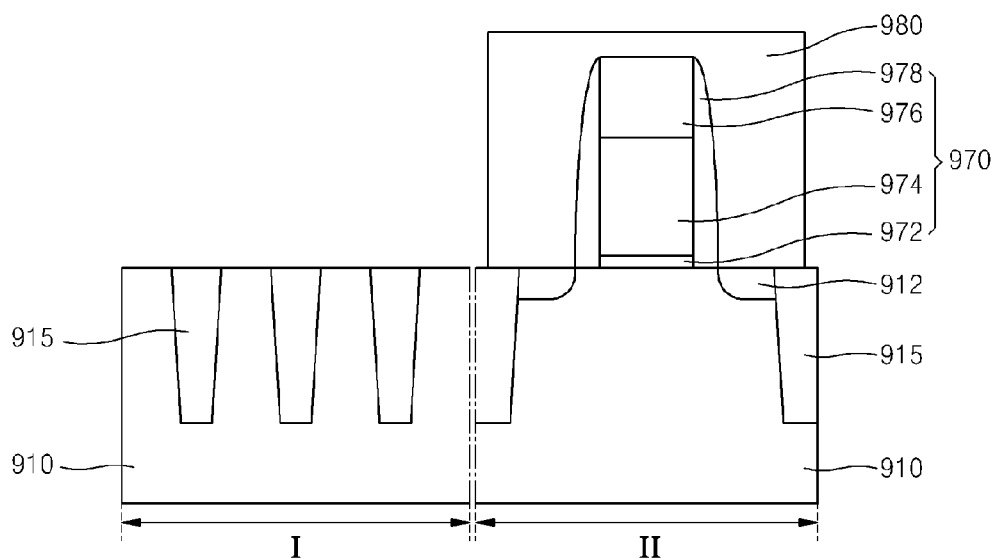
FIGS. 12A through 12C are cross-sectional views for describing a method of manufacturing a semiconductor device, according to example embodiments of the inventive concepts.
Figure 12B:
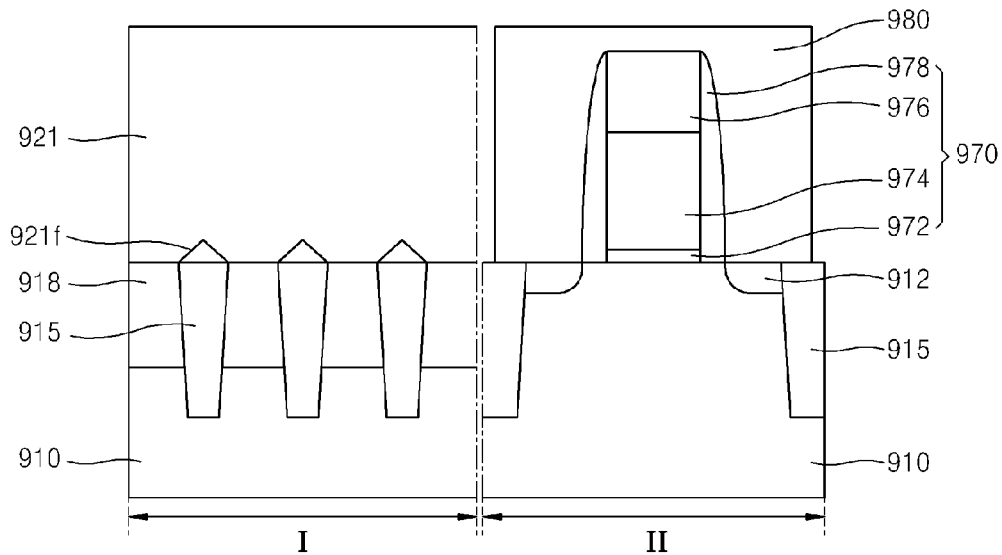
Figure 12C:
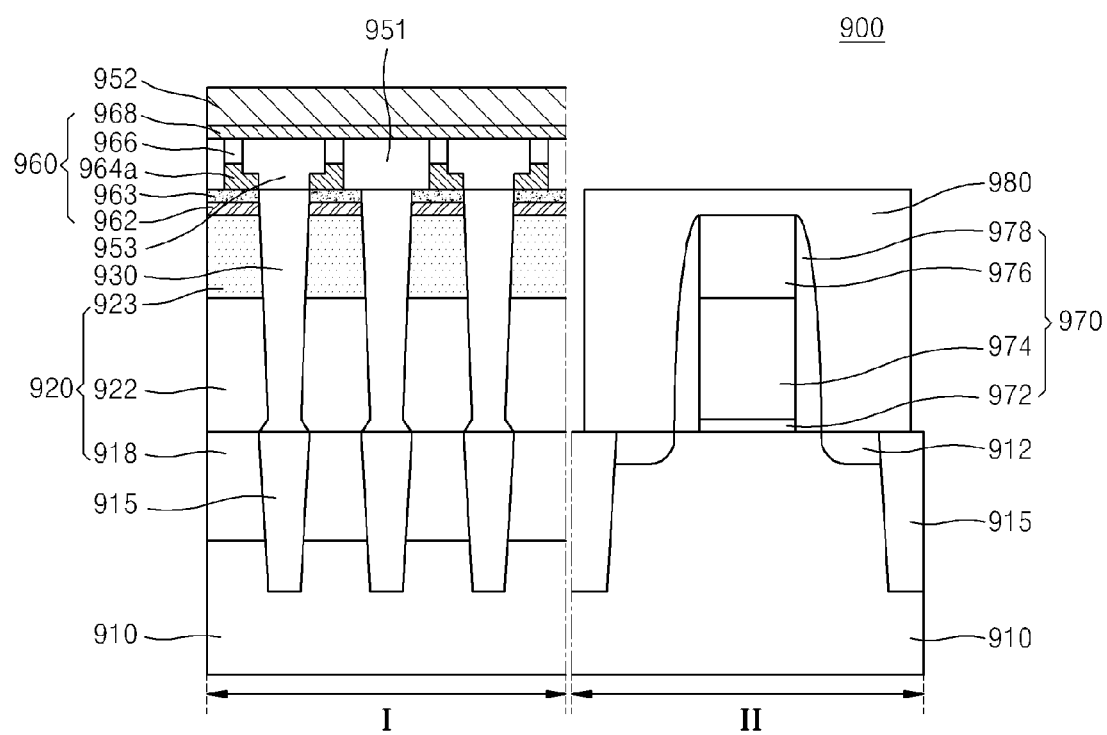

FIGS. 12A through 12C are cross-sectional views for describing a method of manufacturing a semiconductor device 900, according to example embodiments of the inventive concepts.

Referring to FIG. 12A, an isolation layer 915 is formed on a substrate 910 divided into a cell region I and a peripheral circuit region II.

A gate structure 970 including a gate insulation layer 972, a gate electrode 974, a hard mask 976, and a spacer 978 is formed on the substrate 910 in the peripheral circuit region II. According to example embodiments, the gate electrode 974 may be formed using a conductive material, e.g., doped polysilicon, a metal, or a metal nitride. The gate electrode 974 may have a single-layered or a multi-layered structure. For example, the gate electrode 974 may have a multi-layered structure of a doped polysilicon layer and a metal layer, and in example embodiments, a diffusion barrier layer (not shown) may be further formed between the polysilicon and metal layers. The gate insulation layer 972 may be formed using a high dielectric material, e.g., a silicon oxide, a silicon nitride, or a metal oxide. The hard mask 976 may be formed using a silicon nitride.

An impurity region 912 is formed at an upper portion of the substrate 910 adjacent to the gate structure 970 using the gate structure 970 as an ion implantation mask.

A blocking insulation layer 980 covering the gate structure 970 is formed on the substrate 910 in the peripheral circuit region II. The blocking insulation layer 980 may be formed using a silicon nitride. For example, the blocking insulation layer 980 may be formed using a material having an etch selectivity with an insulation layer (not shown) formed in the cell region I in a following process.

Referring to FIG. 12B, a first semiconductor layer 918 is formed by performing an ion implantation process on the substrate 910 in the cell region I. In FIG. 12B, the impurity region 912 of the peripheral circuit region II and the first semiconductor layer 918 are formed by separate processes, but alternatively, the first semiconductor layer 918 may be formed simultaneously with the impurity region 912 of the peripheral circuit region II according to concentration and a type of impurity of the first semiconductor layer 918.

A preliminary semiconductor layer 921 is formed by performing an SEG process using an exposed top surface of the substrate 910 as a seed layer. In FIG. 12B, a facet 921f is formed at a part of the preliminary semiconductor layer 921 contacting the substrate 910, but alternatively, the facet 921f may not be formed and the preliminary semiconductor layer 921 may cover an entire top surface of the isolation layer 915. The preliminary semiconductor layer 921 may have a similar height as the blocking insulation layer 980. Accordingly, a process of planarizing insulation layers (not shown) in a following process is easily performed.

Referring to FIG. 12C, a conductive structure 920 and an insulation layer structure 930 are formed by performing the processes described above with reference to FIGS. 4C through 4F. The conductive structure 920 may include the first semiconductor layer 918, a second semiconductor layer 922, and a third semiconductor layer 923. The insulation layer structure 930 may include a first insulation layer (not shown) and a second insulation layer (not shown), which cross each other, as shown in FIG. 4F.

A phase change memory unit 960 and a bit line 952 are formed on the conductive structure 920 and the insulation layer structure 930 by performing the processes described above with reference to FIGS. 10A through 10G. The phase change memory unit 960 may include an ohmic layer pattern 962, a barrier layer 963, a lower electrode 964a, a phase change material layer pattern 966, and an upper electrode 968, which are sequentially formed on the third semiconductor layer 923. The semiconductor device 900 is completed by performing the above processes.

While the inventive concepts have been particularly shown and described with reference to example embodiments thereof, it will be understood that various changes in form and details may be made therein without departing from the spirit and scope of the following claims.

What is claimed is:

1. A semiconductor device comprising:
a first semiconductor layer extending in a first direction on a substrate, the first semiconductor layer having a first conductivity type;
a plurality of second semiconductor layers spaced apart in the first direction on the first semiconductor layer, the plurality of second semiconductor layers having a second conductivity type; and
an insulation layer structure surrounding side walls of the first semiconductor layer and the plurality of second semiconductor layers,
wherein the first semiconductor layer and the plurality of second semiconductor layers have a same crystalline direction as the substrate.

2. The semiconductor device of claim 1, wherein the side walls of the first semiconductor layer have a slope.

3. The semiconductor device of claim 1, wherein a width of the first semiconductor layer in a second direction perpendicular to the first direction is less than or equal to 30 nm.

4. The semiconductor device of claim 1, wherein a width of each of the plurality of second semiconductor layers in a second direction perpendicular to the first direction is less than or equal to 30 nm.

5. The semiconductor device of claim 1, wherein a lower width of the first semiconductor layer is larger than an upper width of the first semiconductor layer.

6. The semiconductor device of claim 1, wherein a first upper surface of the first semiconductor layer is higher than a second upper surface of the first semiconductor layer, the first upper surface including the plurality of second semiconductor layers formed thereon and the second upper surface not including the plurality of second semiconductor layers.

7. The semiconductor device of claim 1, wherein a height of the first semiconductor layer on which the plurality of second semiconductor layers are formed is lower than a height of the first semiconductor layer on which the plurality of second semiconductor layers are not formed.

8. The semiconductor device of claim 1, wherein the first semiconductor layer includes at least one facet at one end contacting the substrate, the at least one facet tilting at an angle from an upper surface of the substrate.

9. The semiconductor device of claim 1, further comprising:
an interface layer on an interface of the first semiconductor layer and the insulation layer structure and on an interface of the plurality of second semiconductor layers and the insulation layer structure.

10. The semiconductor device of claim 9, wherein the interface layer is a thermal oxide layer.

11. The semiconductor device of claim 1, wherein the insulation layer structure comprises:
a first insulation layer filling a first trench and extending in the first direction, the first trench being defined by an upper surface of the substrate and side walls of the first semiconductor layer and the plurality of second semiconductor layers; and
a second insulation layer filling a second trench and extending in a second direction perpendicular to the first direction, the second trench being defined by an upper surface of the first semiconductor layer not covered by the plurality of second semiconductor layers and the side walls of the plurality of second semiconductor layers.

12. The semiconductor device of claim 1, wherein
the first semiconductor layer is a plurality of first semiconductor layers,
a bottom surface of the insulation layer structure extends in the first direction between adjacent semiconductor layers of the plurality of first semiconductor layers, and
an upper surface of the insulation layer structure has a mesh shape connected in the first direction and a second direction perpendicular to the first direction.

13. A semiconductor device comprising: a plurality of first conductive structures extending in a first direction on a substrate; and a plurality of second conductive structures extending in a second direction and spaced apart in the first direction on the plurality of first conductive structures, wherein the plurality of first and second conductive structures include single crystal semiconductor layers and wherein the plurality of first and second conductive structures have a same crystalline direction as the substrate.

14. The semiconductor device of claim 13, further comprising:
an insulation layer structure surrounding side walls of the plurality of first and second conductive structures; and
a plurality of phase change memory units on the plurality of second conductive structures, each of the plurality of phase change memory units including a lower electrode, a phase change material layer pattern, and an upper electrode.

15. The semiconductor device of claim 13, wherein the side walls of the plurality of first conductive structures have a slope.

16. The semiconductor device of claim 13, wherein a lower width of the plurality of first conductive structures is larger than an upper width of the plurality of first conductive structures.

* * * * *